United States Patent
Sato

(10) Patent No.: US 6,947,338 B2
(45) Date of Patent: Sep. 20, 2005

(54) MEMORY DEVICE

(75) Inventor: Takahiko Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/826,253

(22) Filed: Apr. 19, 2004

(65) Prior Publication Data

US 2005/0099850 A1 May 12, 2005

(30) Foreign Application Priority Data

Nov. 7, 2003 (JP) ........................................ 2003-378326

(51) Int. Cl.[7] ............................................. G11C 16/04
(52) U.S. Cl. ............................ 365/189.05; 365/189.06; 365/189.07
(58) Field of Search .............................. 365/189.1, 222, 365/189.05, 189.06, 189.07, 189.04

(56) References Cited

U.S. PATENT DOCUMENTS

2004/0199717 A1 * 10/2004 Kanda et al. ................ 711/106

FOREIGN PATENT DOCUMENTS

| JP | 11007770 A | 1/1999 |
|---|---|---|
| JP | 2001351377 A | 12/2001 |
| JP | 2003007060 A | 1/2003 |

\* cited by examiner

*Primary Examiner*—Anh Phung
*Assistant Examiner*—Hien Nguyen
(74) *Attorney, Agent, or Firm*—Arent Fox PLLC

(57) ABSTRACT

A memory device is provided, which includes a data receive gate to buffer, in a first buffer, data to be inputted, a data transfer gate to input the data of the first buffer and buffer the same data in a second buffer, a data write gate to output the data of the second buffer to a data bus, and a memory cell to write and store the data in the data bus. In a control circuit thereof, data is not inputted to the first buffer by controlling the data receive gate and at the same time data is inputted to the second buffer by controlling the data transfer gate, depending on a time period from activation of a write enable signal to changing of a data mask signal.

20 Claims, 20 Drawing Sheets

F I G. 3A
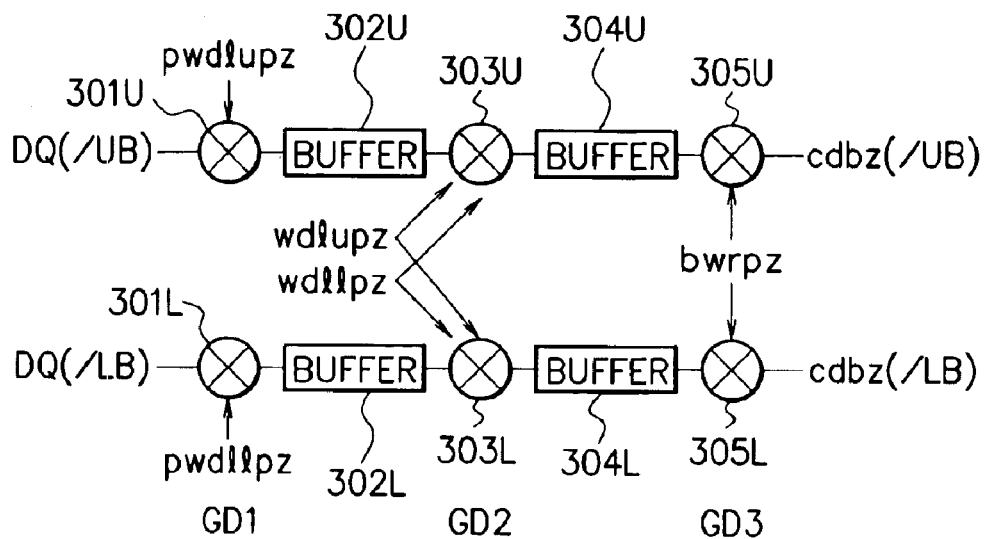
F I G. 3B
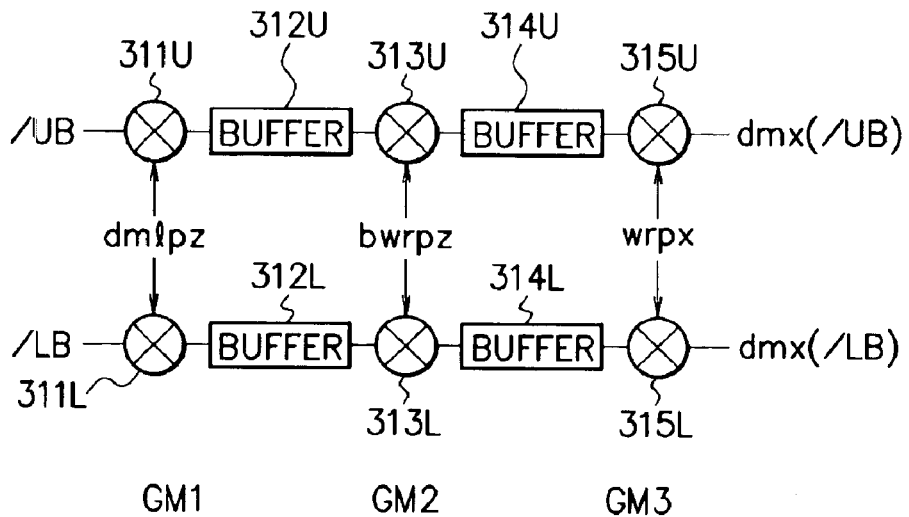

F I G. 5
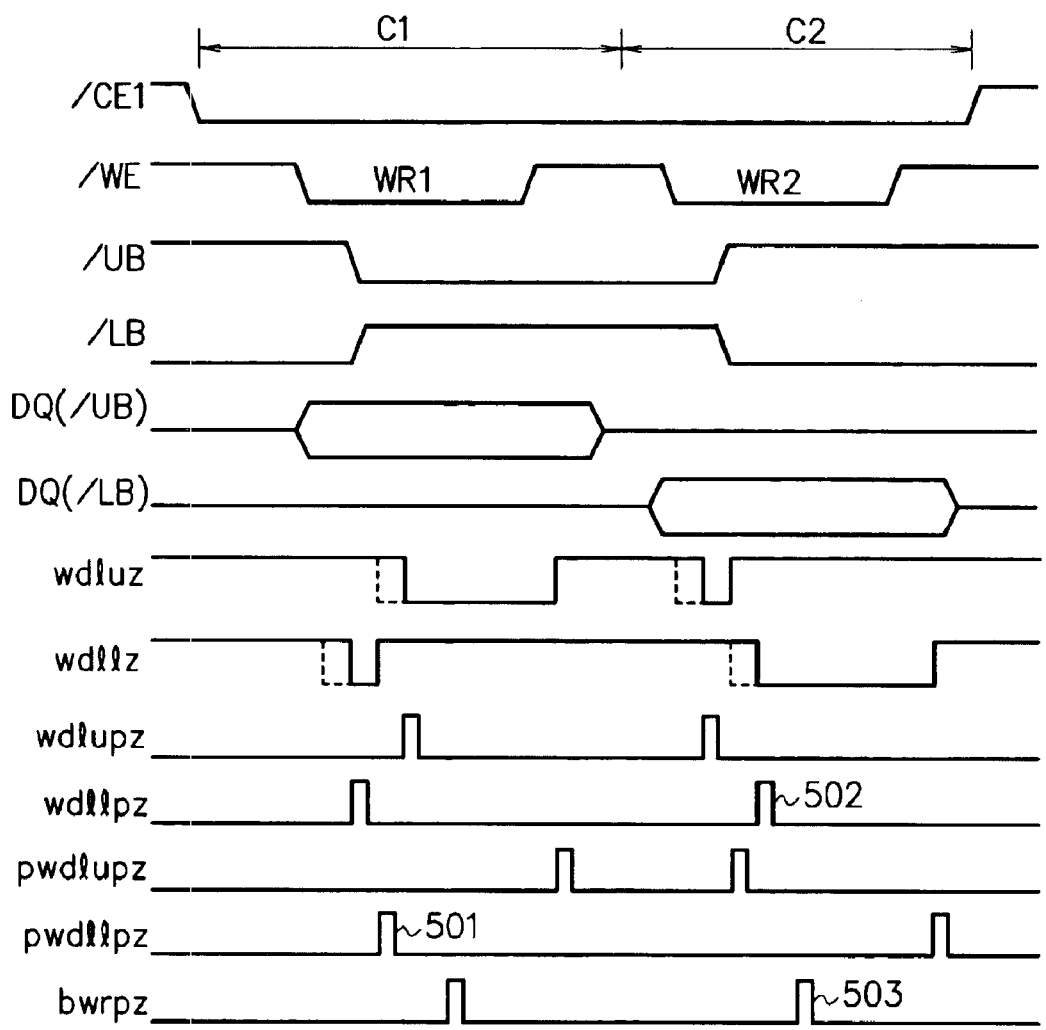

F I G. 7
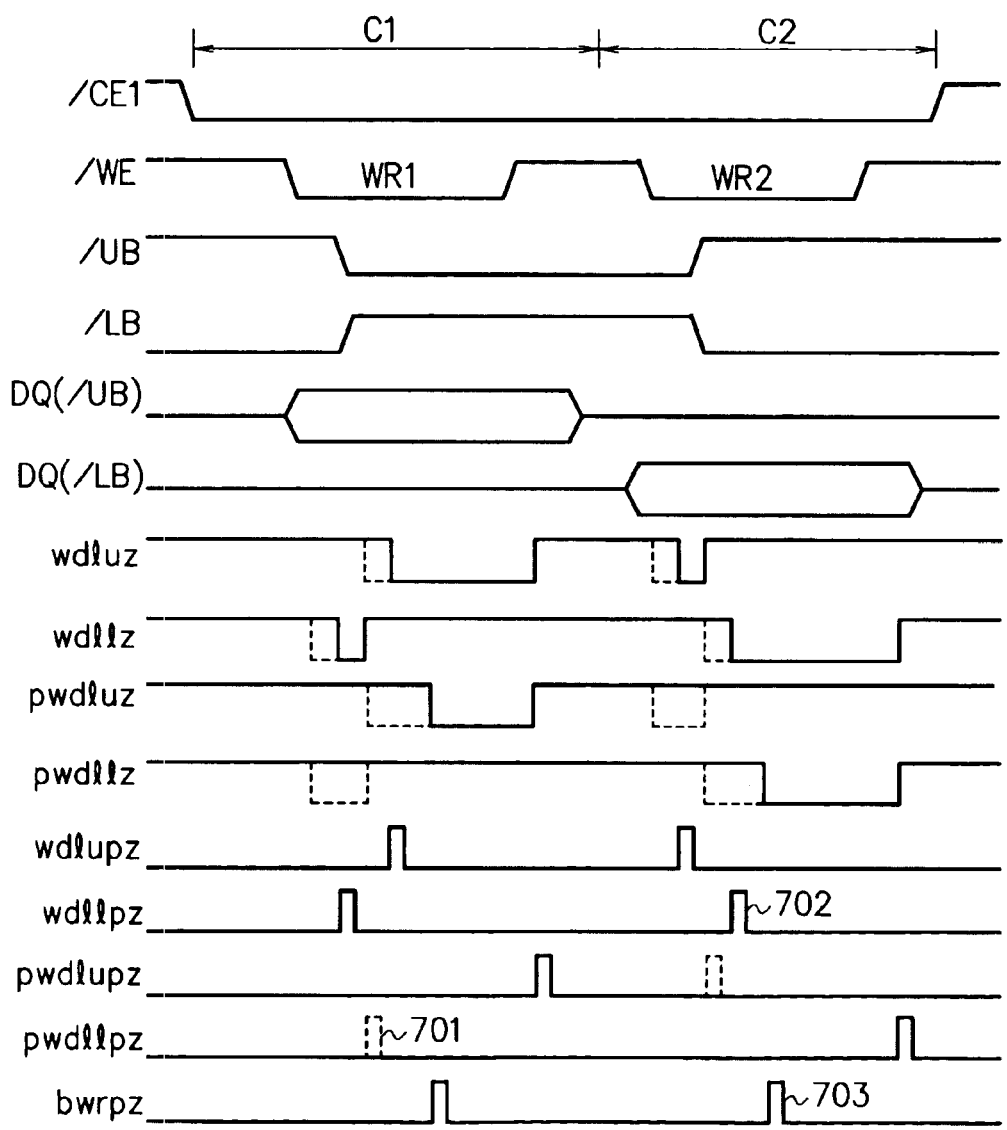

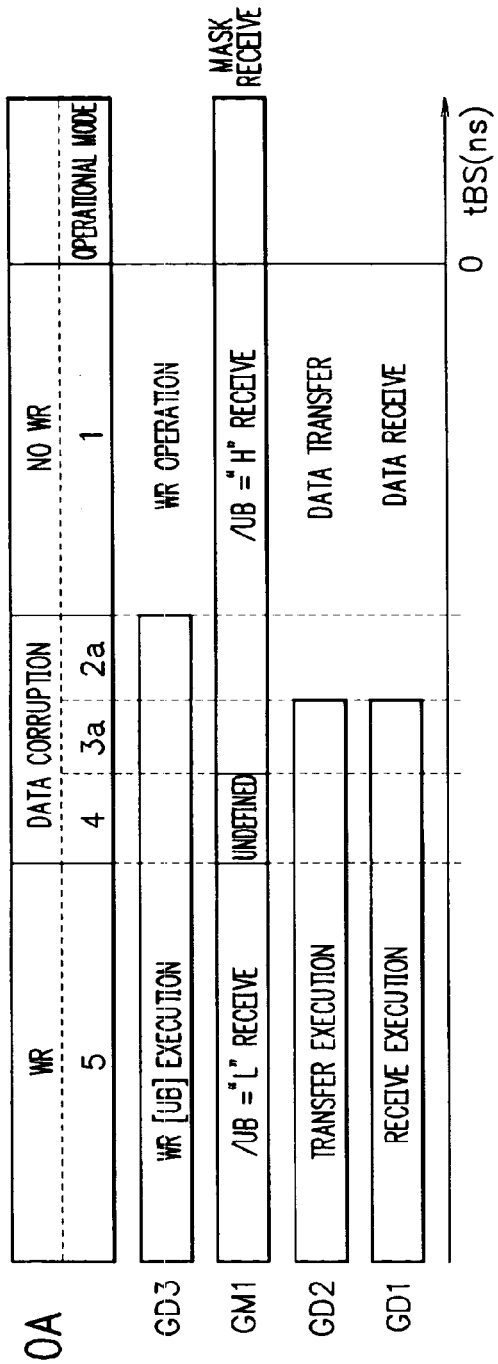
F I G. 10A
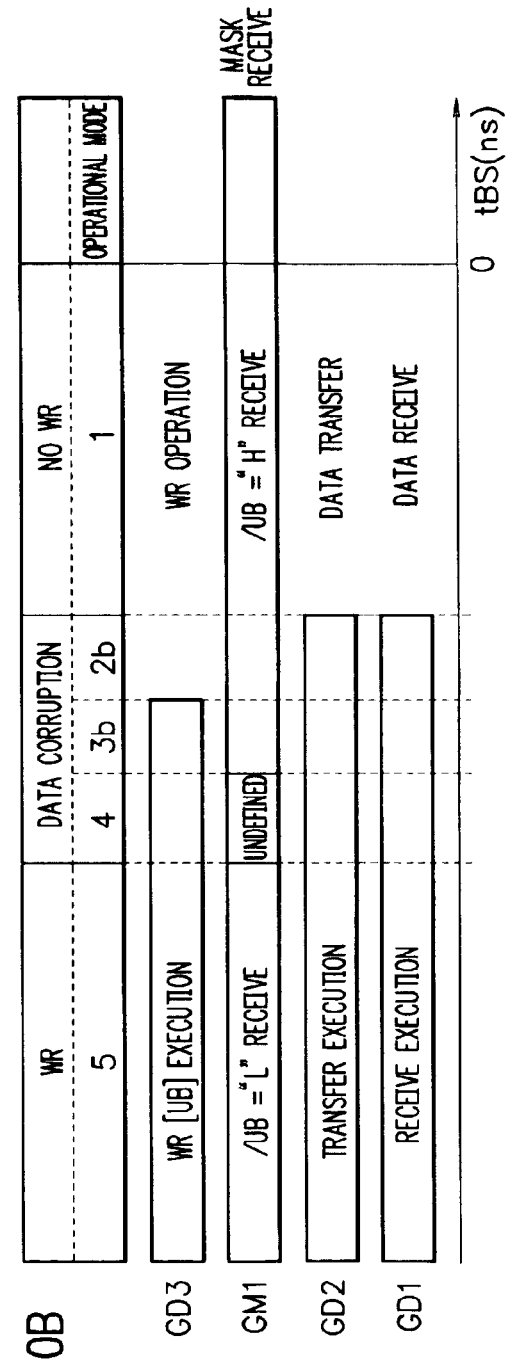
F I G. 10B

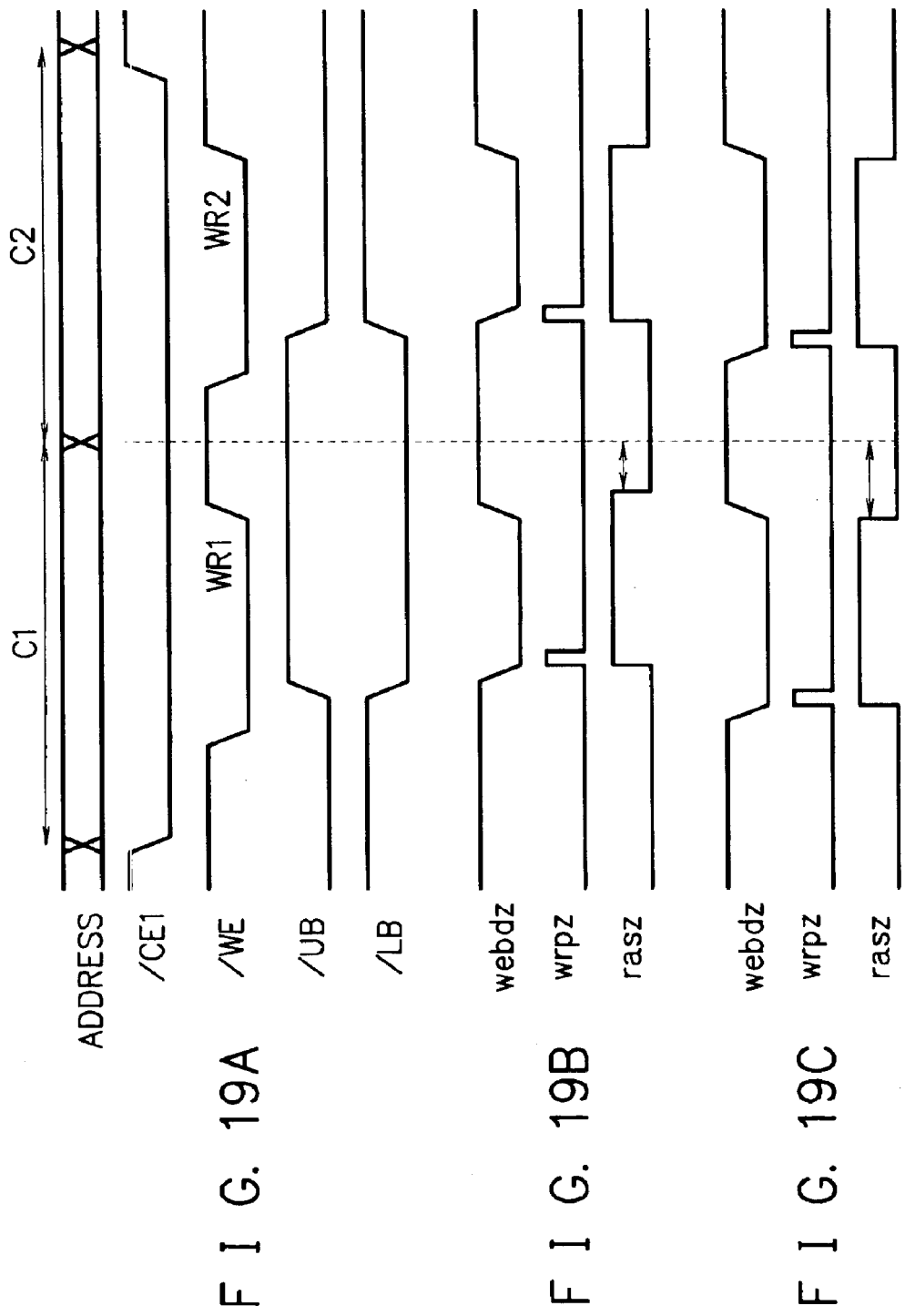

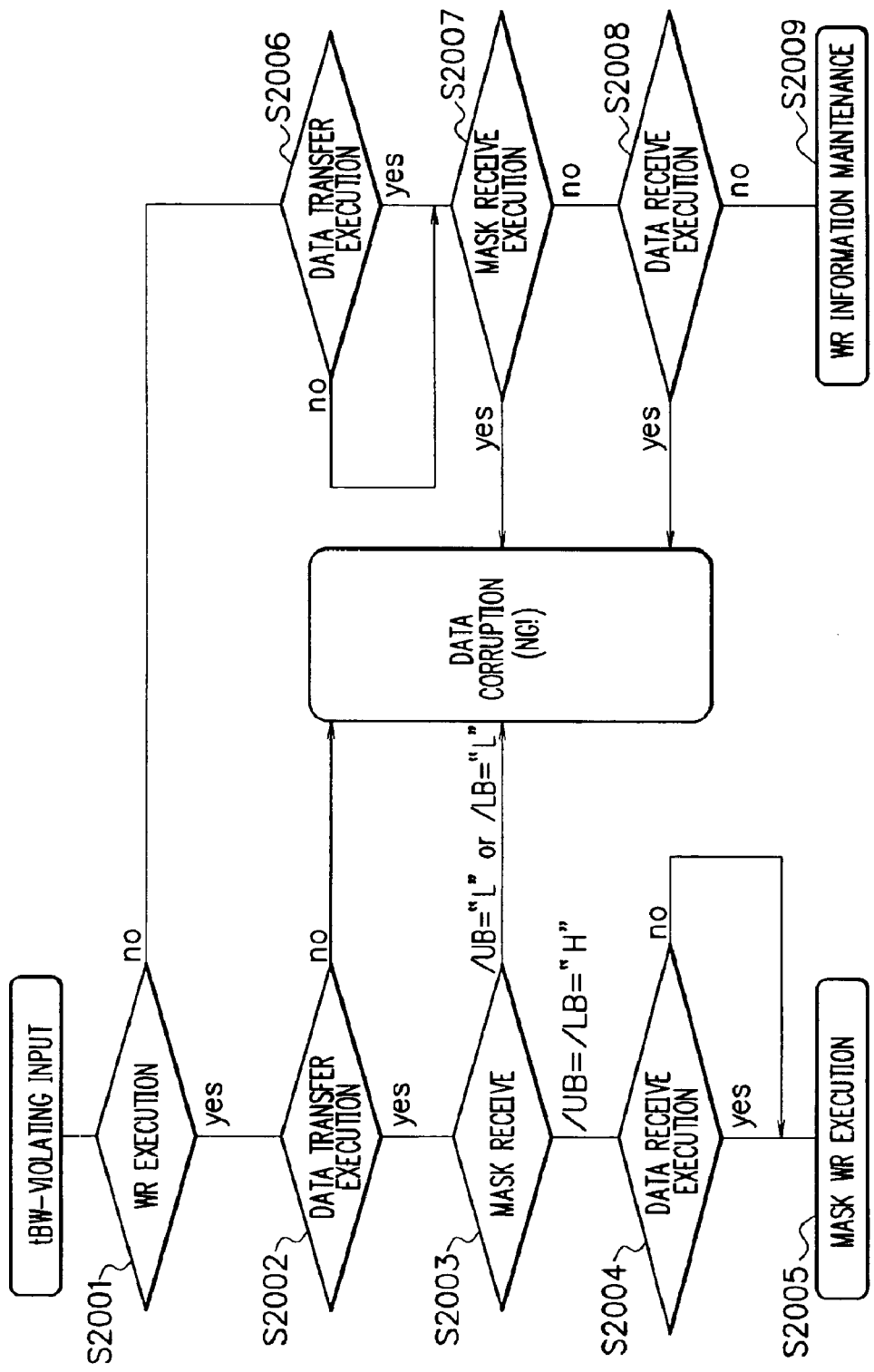

MEMORY DEVICE

CROSS-REFERENCE TO RELATED APPLICATIONS

This application is based upon and claims the benefit of priority from the prior Japanese Patent Application No. 2003-378326, filed on Nov. 7, 2003, the entire contents of which are incorporated herein by reference.

BACKGROUND OF THE INVENTION

1. Field of the Invention

This invention relates to a memory device and, more particularly, to a memory device to write data to a memory cell according to a write enable signal and a data mask signal.

2. Description of the Related Art

There are memory devices which write data to memory cell according to a write enable signal and a data mask signal. These memory devices receive data in a buffer at a present cycle, and transfer and write the data in a subsequent cycle, according to the write enable signal and the data mask signal.

In such a memory device, it is necessary to prevent erroneous writing of data due to writing malfunction. There, a delay in a write operation also has to be avoided.

In a semiconductor memory device, when a write operation is externally directed in a last-second state of whether to perform writing or not, one of (1) not to perform writing, and (2) to perform writing and receive data or a masking state correctly, has to be executed. When performing the write operation, receiving of unwanted mask data which is being transferred, or writing of a prior data using another address without receiving new data, must be avoided. However, any measure to control occurrence of write commands results in a slow-down of a write operation and a write cycle.

Another conventional arts are also published in the following patent documents 1 to 3.

[Patent Document 1]
Japanese Patent Application Laid-open No. Hei 11-7770
[Patent Document 2]
Japanese Patent Application Laid-open No. 2003-7060
[Patent Document 3]
Japanese Patent Application Laid-open No. 2001-351377

SUMMARY OF THE INVENTION

It is an object of the present invention to provide a memory device to prevent data corruption without causing delay in write operation.

According to an aspect of the present invention, is provided a memory device including: a data receive gate to buffer data inputted by gate control in a first buffer; a data transfer gate to input the data of the first buffer and buffer the data in a second buffer by gate control; a data write gate to output the data of the second buffer to a data bus by gate control; a memory cell to write and store the data on the data bus; a selector not to connect the data bus to a memory cell in the case of masking through a data mask signal, and to connect the data bus to the memory cell when the masking is released through the data mask signal; and a control circuit to, according to a write enable signal and a data mask signal, input data by controlling the data receive gate in a present cycle, and in a subsequent cycle input the data of the first buffer in the second buffer by controlling the data transfer gate and output the data of the second buffer to a data bus by controlling the data write gate. In the control circuit, data is inputted to the first buffer by controlling the data receive gate, while data is inputted to the second buffer by controlling the data transfer gate, in a certain cycle according to a time period from an activation of the write enable signal to a change in the data mask signal.

BRIEF DESCRIPTION OF THE DRAWINGS

FIG. 3A illustrates a configuration example of the data input circuit in FIG. 2, and FIG. 3B illustrates a configuration example of the mask input circuit in FIG. 2.

FIG. 5 is a timing chart showing operations of the circuit shown in FIG. 4.

FIG. 7 is a timing chart showing operations of the circuit in FIG. 6.

FIGS. 10A and 10B illustrate operational modes of the referential example in FIG. 4.

FIGS. 19A to 19C are timing charts showing examples of write operations.

FIG. 20 is a flowchart showing a processing example of the write operation according to the present embodiment.

DETAILED DESCRIPTION OF THE PREFERRED EMBODIMENTS

Figure 1:
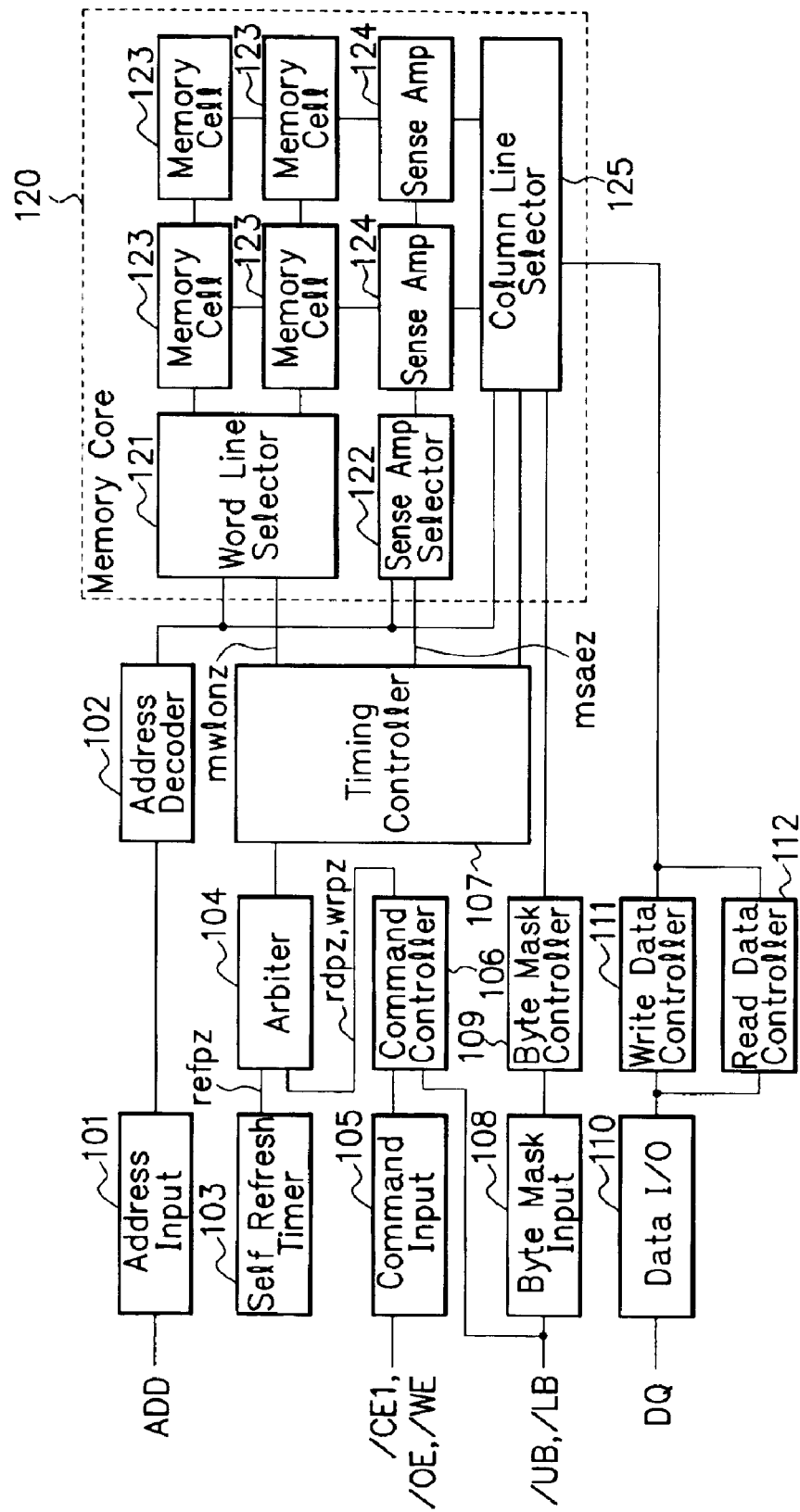
FIG. 1 is a block diagram showing a configuration example of a semiconductor memory device (memory device) according to an embodiment of the present invention.

FIG. 1 is a block diagram showing a configuration example of a semiconductor memory device (memory device) according to an embodiment of the present invention. A memory core 120 contains a word line selector 121, a sense amplifier selector 122, a memory cell 123, a sense amplifier 124 and a column line selector 125.

An address ADD is supplied to an address decoder 102 through an address input circuit 101. The address decoder 102 performs decoding based on the address ADD, and outputs a control signal to the selectors 121, 122, and 125.

A self refresh timer 103 outputs a refresh command refpz to an arbiter 104. A chip enable signal /CE1, an output enable signal /OE, and a write enable signal /WE are supplied to a command controller 106 through a command input circuit 105. An upper byte mask signal /UB enables an upper byte by releasing masking, and disables an upper byte by masking. A lower byte mask signal /LB enables a lower byte by releasing masking, and disables a lower byte by masking. The command controller 106 outputs a read command rdpz or a write command wrpz to the arbiter 104 based on the signals /CE1, /OE, /WE, /UB, and /LB.

The read command rdpz is a command to read data from the memory cell 123. The write command wrpz is a command to write data to the memory cell 123. The refresh command refpz is a command to refresh the memory cell 123.

The refreshing is an operation to supply electric charge in order for a memory of a DRAM not to be lost. The DRAM, which is one form of the semiconductor memory device, has a condenser in the memory cell 123 thereof, and keeps its data by storing electric charge in the condenser. The electric charge thereof decreases as time passes, and after a certain time, data are lost with a complete discharge, if being left. To prevent the discharge, the DRAM needs to perform a refresh operation in which charge injection is carried out at certain intervals.

During the refresh operation, neither reading nor writing can be performed. On the other hand, refreshing cannot be carried out during reading or writing. Hence, upon occurrence of the read command rdpz or the write command wrpz during the refreshing, the read or the write operation is kept on standby. On the other hand, when the refresh command refpz occurs during the reading or the writing, the refresh operation is kept on standby. The arbiter 104 outputs the refresh command refpz, the read command rdpz, and the write command wrpz to a timing controller 107 in chronological order.

The timing controller 107 outputs control signals mwlonz, msaez, and so forth to the word line selector, the sense amplifier selector 122, and the column line selector 125, according to the refresh command refpz, the read command rdpz, and the write command wrpz. The control signal mwlonz is supplied to the word line selector 121, and the control signal msaez is supplied to the sense amplifier selector 122.

The upper byte mask signal /UB and the lower byte mask signal /LB are supplied to a byte mask controller 109 through a byte mask input circuit 108. Based on the signals, the byte mask controller 109 outputs a control signal to the column line selector 125.

The memory cell 123 in a two-dimensional array is specified by a word line and by a column line. The word line selector 121 selects and activates the word line according to the control signal. The column line selector 125 selects the column line according to the control signal. When a write command wrpz occurs, data can be written to and stored in the specified memory cell 123. When a read command rdpz occurs, data can be read out from the specified memory cell 123. Data access to and from the memory cell 123 is carried out according to the read command rdpz and the write command wrpz. The sense amplifier selector 122 activates the sense amplifier 124 according to a control signal. The sense amplifier 124 amplifies a signal (data) on a bit line of the memory cell 123.

When the read command rdpz occurs, a read data controller 112 reads data from the memory cell 123 through the column line selector 125, and outputs a data DQ externally through a data I/O circuit 110.

When the write command wrpz occurs, a write data controller 111 inputs the data DQ through the data I/O circuit 110 and write the data to the memory cell 123 through the column line selector 125.

Figure 2:
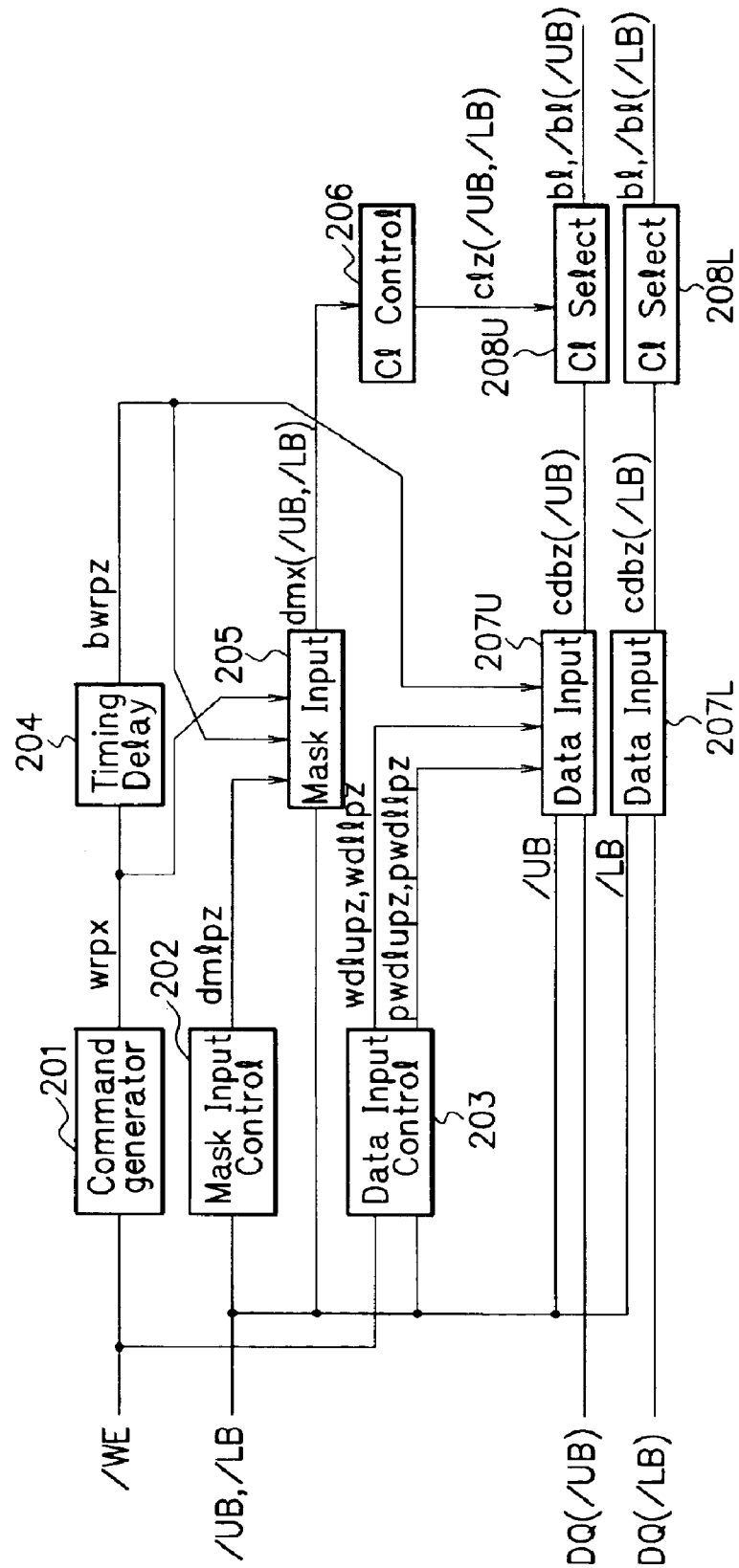
FIG. 2 is a block diagram showing a configuration example of a byte mask input circuit, a byte mask controller, a data I/O circuit, a write data controller, and a column line selector in the FIG. 1.

FIG. 2 is a configuration example of the byte mask input circuit 108, the byte mask controller 109, the data I/O circuit 110, the write data controller 111, and the column line selector 125.

A command generator 201 outputs a write command signal wrpx based on the write enable signal /WE. The write command signal wrpx is a pulse signal generated at a time when the falling of the write enable signal /WE is delayed. A timing delay circuit 204 outputs a write command signal bwrpz adjusting timing by delaying the write command signal wrpx.

A mask input control circuit 202 generates a signal dmlpz based on the data byte mask signals /UB and /LB. A mask input circuit 205 outputs signals dmx(/UB) and dmx(/LB) based on the signals /LB, /UB, dmlpz, wrpx, and bwrpz. Details of the mask input circuit 205 will be described later with reference to FIG. 3B. A column line control circuit 206 outputs signals clz(/UB) and clz(/LB) based on the signals dmx(/UB) and dmz(/LB).

The data input control circuit 203 outputs upper byte signals wdlupz and pwdlupz, and lower byte signals wdllpz and pwdllpz, based on the write enable signal /WE and the data byte mask signals /UB and /LB.

An upper byte data input circuit 207U inputs upper byte data DQ(/UB) and outputs upper byte data cdbz(/UB) according to signals /UB, pwdluzp, wdlupz, wdllpz, and bwrpz. A lower byte data input circuit 207L inputs lower byte data DQ(/LB) and outputs lower byte data cdbz(/LB) according to signals /LB, pwdllzp, wdlupz, wdllpz, and bwrpz. Details of the data input circuits 207U and 207L will be described later with reference to FIG. 3A.

To an upper byte column line selecting circuit 208U, the data cdbz(/UB) is inputted, and from the same circuit, bit line signals bl(/UB) and /bl(/UB) are outputted, according to the signal clz(/UB). To a lower byte column line selecting circuit 208L, the data cdbz(/LB) is inputted, and from the same circuit, bit line signals bl(/LB) and /bl(/LB) are outputted, according to the signal clz. More specifically, the column line selecting circuits 208U and 208L selectively connects the data bus (signal cdbz) and the bit lines of the memory cell 124 (signals bl, /bl).

FIG. 3A shows a configuration example of the data input circuits 207U and 207L in FIG. 2. First, the configuration example of the upper byte data input circuit 207U is explained. A data receive gate 301U buffers, in a buffer 302U, upper byte data DQ(/UB) to be inputted, based on gate control by the signal pwdlupz. A data transfer gate 303U inputs the data in the buffer 302U and buffers the same data in a buffer 304U, based on gate control by a logical add signal of the signals wdlupz or wdllpz. A data write gate 305U outputs the data in the buffer 304U to a data bus as signal cdbz(/UB), based on gate control by the signal bwrpz.

Next, the configuration example of the lower byte data input circuit 207L is explained. A data receive gate 301L buffers, in a buffer 302L, lower byte data DQ(/LB) to be inputted, based on gate control by the signal pwdllpz. A data transfer gate 303L inputs the data of the buffer 302L and buffers the same data in a buffer 304L, based on gate control by a logical add signal of the signal wdlupz or wdllpz. A data write gate 305L outputs the data in the buffer 304L to a data bus as a signal cdbz (/LB) based on gate control by the signal bwrpz.

Hereinafter, the data receive gates 301U and 301L are collectively called a data receive gate GD1, the data transfer gates 303U and 303L are collectively called a data transfer gate GD2, and the data write gates 305U and 305L are collectively called a data write gate GD3.

FIG. 3B shows a configuration example of the mask input circuit 205 in FIG. 2. First, the circuit of the upper byte mask signal /UB is explained. A mask receive gate 311U buffers, in a buffer 312U, the upper byte mask signal /UB to be inputted, based on gate control by the signal dmlpz. A mask transfer gate 313U inputs the mask signal of the buffer 312U and buffer the same signal in a buffer 314U, based on gate control by the signal bwrpz. A mask write gate 315U outputs the mask signal in the buffer 314U as signal dmx(/UB) based on gate control by the signal wrpx.

Next, the circuit of the lower byte mask signal /LB is explained. A mask receive gate 311L buffers, in a buffer 312L, the lower byte mask signal /LB to be inputted, based on gate control by the signal dmlpz. A mask transfer gate 313L inputs the mask signal of the buffer 312L and buffers the same signal in a buffer 314L, based on gate control by the signal bwrpz. A mask write gate 315L outputs the mask signal in the buffer 314L as signal dmx(/LB) based on gate control by the signal wrpx.

Hereinafter, the mask receive gates 331U and 311L are collectively called a mask receive gate GM1, the mask transfer gates 313U and 313L are collectively called a mask transfer gate GM2, and the mask write gates 315U and 315L are collectively called a mask write gate GM3.

Figure 4:
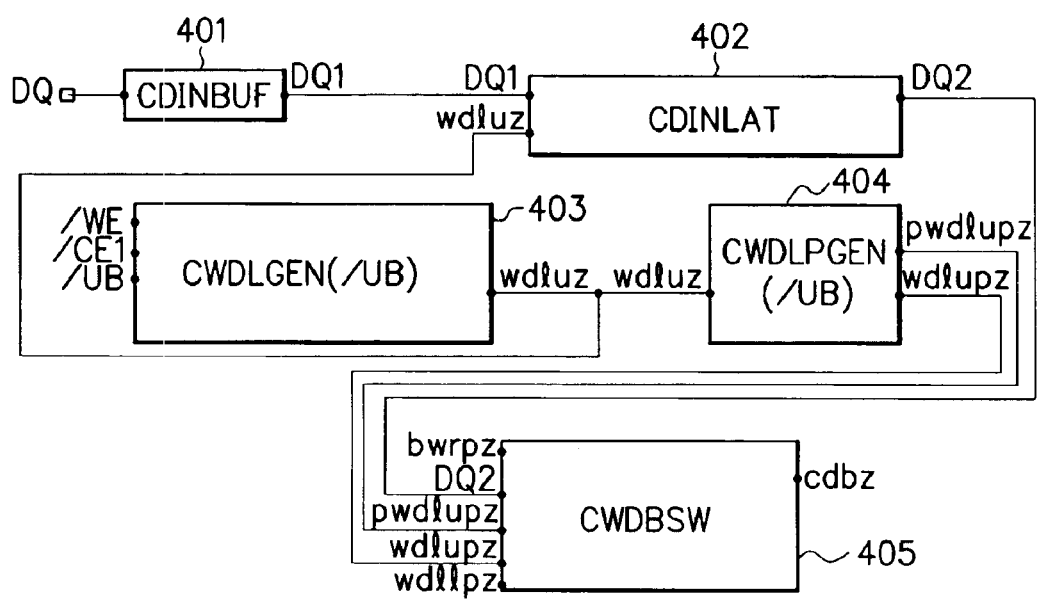
FIG. 4 illustrates a configuration example according to a referential example of the data input control circuit and the data input circuit in the FIG. 2.

FIG. 4 is a configuration example according to a referential example of the data input control circuit 203 and the data input circuit 207U in FIG. 2. While FIG. 4 illustrates the configuration of the circuit of the upper byte, the configuration of the lower byte circuit is in the same manner as in the upper byte circuit. FIG. 5 is a timing chart to show operations of the circuit in FIG. 4. In FIG. 5, the write cycle C1 or C2 is determined according to the switching of the address ADD (FIG. 1). The first cycle C1 is a cycle for a first write operation WR1, and the second cycle C2 is a cycle for a second write operation WR2.

A CDINBUF circuit 401 outputs a data DQ1 by buffering a data DQ(/UB). To a CDINLAT circuit 402, the data DQ1 is inputted, and from the same circuit, a data DQ2 is outputted by adjusting the setup/hold timing, according to control by the signal wdluz.

To a CWDLGEN(/UB) circuit 403, a write enable signal /WE, a chip enable signal /CE1, and an upper byte mask signal /UB are inputted, and from the same circuit, a signal wdluz is outputted. Specifically, the CWDLGEN(/UB) circuit 403 generates a first signal (the signal wdluz shown in dotted line) to activate a period during which the chip enable signal /CE1 and the write enable signal /WE are activated (low level) and at the same time the upper level mask signal /UB indicates a mask release (low level), and outputs, as a first delay signal wdluz, a signal which delays a changing point at which the first signal changes from a deactivated state (high level) to an activated state (low level).

To a CWDLPGEN (/UB) circuit 404, the signal wdluz is inputted, and from the same circuit, the signals pwdlupz and wdlupz are outputted. The signal wdlupz is a data transfer gate pulse signal to generate a pulse at a changing point at which the signal wdluz changes from high level into low level. The signal pwdlupz is a data receive gate pulse signal to generate a pulse at a changing point at which the signal wdluz changes from low level to high level.

To a CWDBSW circuit 405, which corresponds to the circuit shown in FIG. 3A, the data DQ2 is inputted, and from the same circuit, a data cdpz is outputted based on control by signals bwrpz, pwdlupz, wdluz, and wdllpz. The signal bwrpz generates a pulse at a point up to which the falling of the write enable signal /WE is delayed. As shown in FIG. 3A, the data receive gate GD1 inputs the data DQ2 to the buffer 302U according to gate control by the signal pwdlupz. The data transfer gate GD2 inputs data to the buffer 304U according to a logical add signal of the signals wdlupz and wdllpz. The data write gate GD3 outputs the data in the buffer 304U to the data bus according to control by the signal bwrpz.

As described above, a high/low level judgment of the inputted data DQ (/UB) is carried out in the CDINBUF circuit 401, the setup/hold timing adjustment is carried out in the CDINLAT circuit 402, and data is transferred to the data bus in the CWDBSW circuit 405. In the CWDBSW circuit 405, the upper byte data DQ2 is received in the buffer 302U with the signal pwdlupz, and the data is transferred to the buffer 304U with the signal wdlupz or the signal wdllpz. The timing for data transfer to the data bus is adjusted by carrying out such transfer according to the signal bwrpz which is generated when writing of the data is performed. Such control of receiving and transferring data is performed in the CWDLGEN circuit 403 and the CWDLPGEN circuit 404, providing the filtering to judge whether to perform a write operation or to wait without performing the writing in the CWDLGEN circuit 403, in which the data transfer pulse signal wdlupz and the data receive pulse signal pwdlupz are generated from the respective edges of the falling and the rising of the output signal wdluz. Hence, a highly precise adjustment of the boundary of performing or not performing the write operation and the presence of data receive and data transfer is necessary, since the avoidance of a data receive in the case of non-performing of a write operation which causes data corruption results in non-performing of data transfer.

Under normal circumstances, the byte mask signals /UB and /LB should be changed and determined before the falling of the write enable signal /WE. However, as shown in FIG. 5, in some cases the changes of byte mask signals /UB and /LB occur later than the falling of the write enable signal /WE, because of variations and fluctuations of the power supply voltage or the elements. In such cases, the control not to bring a malfunction is necessary.

In normal circumstances, the falling of the write enable signal /WE and the changing point of the byte mask signals /UB and /LB coincide. In that case, in the cycle C1 for example, data is received in the buffer 302U with the data receive gate signal pwdlupz. In the subsequent cycle C2, the data is transferred to the buffer 304U with the data transfer signal wdlupz or wdllpz, and at the same time, the data is outputted to the data bus to be written to the memory cell with the subsequent data write signal bwrpz. These steps form the write cycle.

In the case where the switching of the byte mask signals /UB and /LB occur later than the falling of the write enable signal /WE, a write state to a byte which should have been masked at an early write stage (a lower byte, for example)

occurs in the circuit. As a result, despite that a data at the point of the rising of the lower byte mask signal /LB should not be received at the write operation WR1, the lower byte data DQ (/LB) is received with a pulse 501 of the data receive gate signal pwdllpz in the present cycle C1, and the data is transferred with a pulse 502 of the data transfer gate signal wdllpz, and then outputted to the data bus with a pulse 503 of the data write gate signal bwrpz in the subsequent cycle C2. The data is corrupted since it is written to the memory cell by the write operation performed after the occurrence of the pulse 503. That is to say, since the lower byte data DQ (/LB) is not supplied at the point of the occurrence of the pulse 501, the data received with the pulse 501 is an undefined (improper) data. By writing such data to the memory cell, the data corruption occurs. The above-described problem can be solved by the present embodiment described below.

Figure 6:
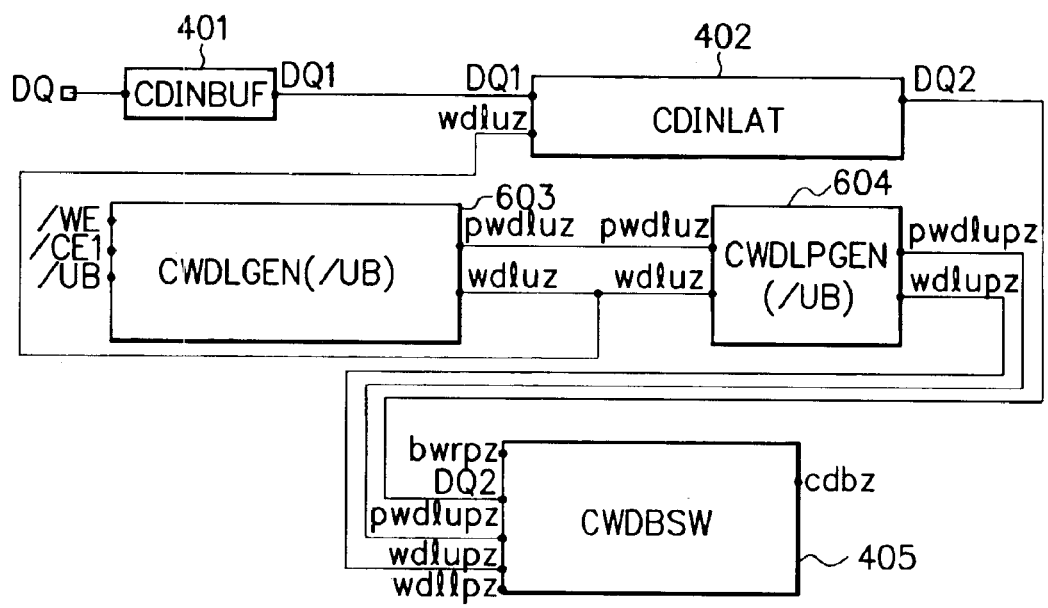
FIG. 6 illustrates a configuration example of the data input control circuit and the data input circuit in FIG. 2 according to a present embodiment.

FIG. 6 shows a configuration example of the data input control circuit 203 and the data input circuit 207U in the FIG. 2 according to the present embodiment. Whilst FIG. 6 shows the configuration of an upper byte circuit, the configuration of a lower byte circuit is in the same manner as that of the upper byte circuit. FIG. 7 is a timing chart to show operations of the circuit in FIG. 6. In FIG. 7, a first cycle C1 and a second cycle C2 are carried out depending on the switching of the address ADD (FIG. 1). The first cycle C1 is a cycle for a first write operation WR1, and the second cycle C2 is a cycle for a second write operation WR2.

The points of differences in the circuit of FIG. 6 compared with the circuit of FIG. 4 are a CWDLGEN (/UB) circuit 603 and a CWDLPGEN (/UB) circuit 604 being provided in place of the CWDLGEN (/UB) circuit 403 and the CWDLPGEN (/UB) circuit 404 respectively.

To the CWDLGEN (/UB) circuit 603, a write enable signal /WE, a chip enable signal /CE1, and an upper byte mask signal /UB are inputted, and from the same circuit, signals wdluz and pwdluz are outputted. More specifically, the CWDLGEN (/UB) circuit 603 generates a first signal (signal wdluz shown in dotted line) to activate (bring to low level) a time period during which the chip enable signal /CE1 and the write enable signal /WE are activated (low level) and at the same time the upper byte mask signal /UB are indicating a mask release (low level), and outputs, as a first delay signal wdluz, the signal which delays the changing point at which the first signal changes from the deactivated state (high level) into the activated state (low level) for a first delay time period. Further, the CWDLGEN (/UB) circuit 603 outputs, as a second delay signal pwdluz, the signal which delays the changing point at which the above-described first signal (signal pwdluz shown in dotted line) changes from the deactivated state (high level) into the activated state (low level) for a second delay time period which is longer the first delay time period.

To a CWDLPGEN (/UB) circuit 604, the signals wdluz and pwdluz are inputted, and from the same circuit, signals pwdlupz and wdlupz are outputted. The signal wdlupz is a data transfer gate pulse signal to generate a pulse at a changing point at which the signal wdluz changes from high level to low level. The signal pwdlupz is a data receive gate pulse signal to generate pulse at a changing point at which the signal pwdluz changes from low level to high level.

In the present embodiment, filters for the CWDLGEN circuit 603 are separately prepared for the data receive signal and the data transfer signal. This allows a state in which data transfer (with the signal wdllpz) is performed while data receive (with the signal pwdllpz) is not performed. As a result, a data corruption caused by a subsequent data passing through to the data bus as shown in FIGS. 4 and 5 can be prevented. This feature will be explained later in detail with reference to FIGS. 8A to 8C.

In FIG. 7, the lower byte mask signal is at high level (in masked state) in a cycle C1, and the lower byte data DQ (/LB) is not supplied. The lower byte data receive pulse 701 does not occur, so that it is prevented to receive and write undefined (improper) data in the memory cell. Specifically, in a subsequent cycle C2, a data transfer pulse 702 and a data write pulse 703 occur, and a preceding data is supplied to the data bus. However, since the lower byte mask signal /LB is supplied to the column line selecting circuit 208L (FIG. 2) as high level, the data bus is not connected to the memory cell. As a result, writing to the memory cell is not performed, so that the data corruption does not occur.

Subsequently, the lower byte receive gate signal pwdllpz generates a pulse in the cycle C2, and the lower byte data DQ (/LB) is received. Further in the following cycle, the data is transferred with the data transfer gate signal, and supplied to the data bus with the data write gate signal. The lower byte mask signal /LB is then supplied to the column line selecting circuit 208L (FIG. 2) as low level, and the data bus is connected to the memory cell. Consequently, a proper data is written to the memory cell.

As described above, in the cycle C2, when the lower byte data is transferred and the high level of the mask signal is received, the data bus is not connected to the memory cell so that the data corruption does not occur, since the data is not actually written to the memory cell. Accordingly, any loosening of the control to the occurrence of the write command itself does not cause data corruption, and a slow-down of the write cycle operations can be prevented.

Hence, by providing a proper order of precedence for mask receive, data receive, data write, and data transfer, the data corruption does not occur when a write command occurs, so that the delay in the write operation can be prevented.

Figure 8:
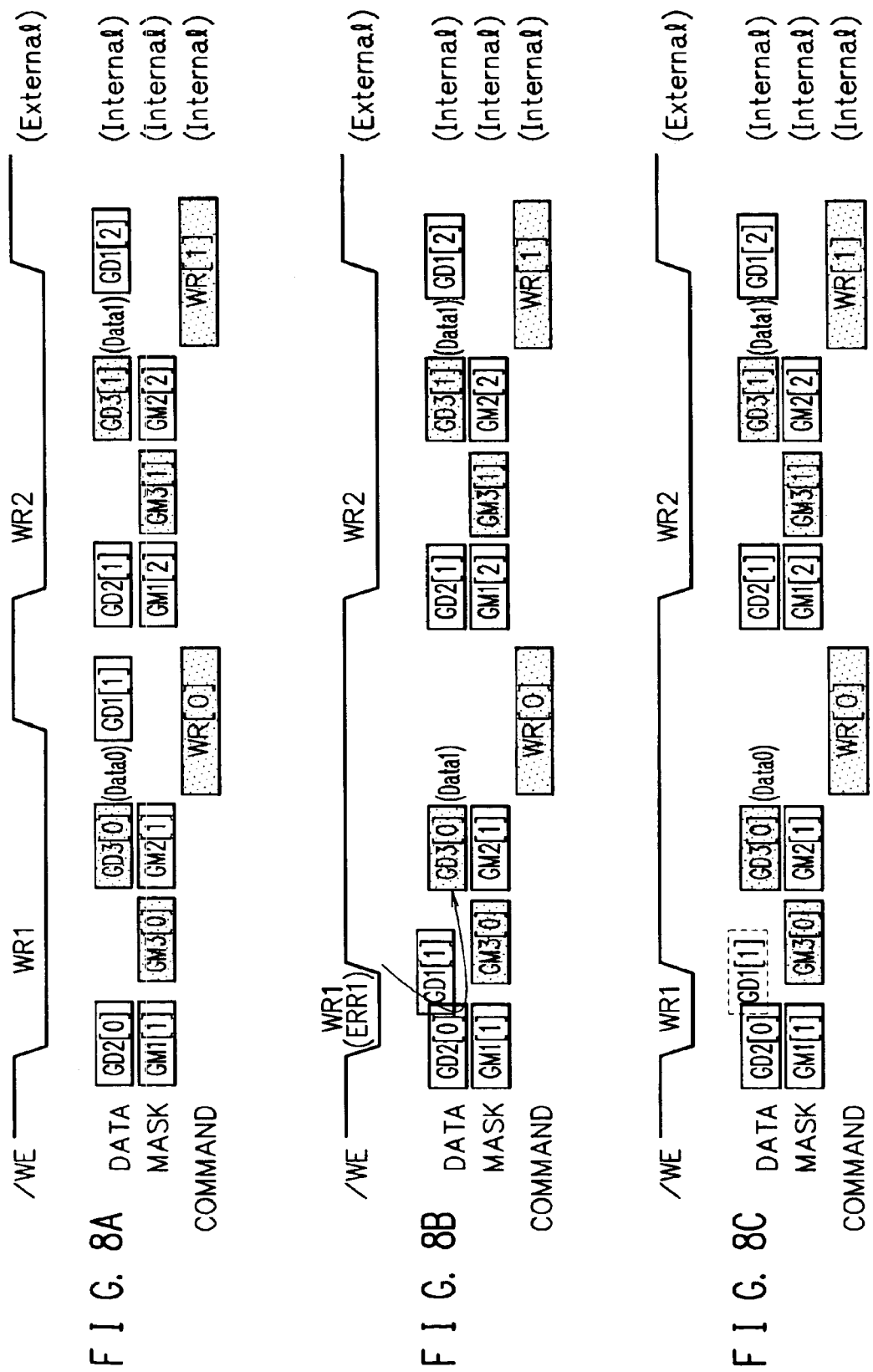
FIGS. 8A to 8C illustrate examples of write operations.

FIGS. 8A to 8C show examples of the write operations. In the examples, write operations WR0, WR1, and WR2 are sequentially performed for each cycle.

FIG. 8A shows an example of a basic write operation. It shows a normal operation in which the low-level period of the write operations WR1 and WR2 is sufficiently long in a write enable signal /WE.

When the write enable signal /WE falls to perform the write operation WR1, data transfer GD2[0] of the write operation WR0 is performed, and mask receive GM1[1] of the write operation WR1 is performed. This is followed by mask write GM3[0] of the write operation WR0. Subsequently, data write GD3[0] of the write operation WR0 is performed, and mask transfer GM2[1] of the write operation WR1 is performed. Thereafter, the data is written to the memory cell with a write command WR[0] of the write operation WR0. Further, when the write enable signal /WE rises, data receive GD1[1] of the write operation WR1 is performed.

Next, when the write enable signal /WE falls to perform the write operation WR2, data transfer GD2[1] of the write operation WR1 is performed, and mask receive GM1[2] of the write operation WR2 is performed. Subsequently, mask write GM3[1] of the write operation WR1 is performed. This is followed by data write GD3[1] of the write operation WR1, and then mask transfer GM2[2] of the write operation WR2. Thereafter, the data is written to the memory cell with a write command WR[1] of the write operation WR1.

Further, when the write enable signal /WE rises, data receive GD1[2] of the write operation WR2 is performed.

FIG. 8B shows a write operation example of the referential example of the memory device in FIG. 4. The example shows a malfunction in the case where the low-level period of the write operation WR1 is short in the write enable signal /WE. When the write enable signal /WE falls to perform the write operation WR1, data transfer GD2[0] of the write operation WR0 is performed, and overlappingly, data receive GD1[1] of the write operation WR1 is performed. This causes a simultaneous opening of the data transfer gate GD2 and data receive gate GD1 in FIG. 3A, because of a partial overlap of the pulse of the data transfer gate signal wdlupz and the pulse of the data receive gate signal pwdlupz. Consequently, instead of the data of the write operation WR0 which should have been stored, the data of the write operation WR1 is erroneously stored in the buffer 304U. In the subsequent data write GD3[0] and the write command WR [0], the data of the write operation WR1 is written to the memory cell, which is a malfunction. This occurs because the data transfer gate signal wdlupz and the data receive gate signal pwdlupz are generated based on the falling and the rising of the same signal wdluz, as shown in FIG. 5. That is to say, when the pulse of the data transfer gate signal wdlupz is generated, the pulse of the data receive gate signal pwdlupz is always generated, causing an overlap of the pulses of the both signals if the low-level period of the write enable signal /WE is short.

FIG. 8C shows a write operation example of the memory device of the present embodiment in FIG. 6. This example shows that a malfunction can be prevented where the low-level period of the write operation WR1 is short in the write enable signal /WE. When the write enable signal /WE falls to perform the write operation WR1, data transfer GD2[0] of the write operation WR0 is performed. However, since the low-level period of the write enable signal /WE is short, data receive GD1[1] of the write operation WR1 is not performed. That is to say, in FIG. 7, when the low-level period of the write enable signal /WE is short, the low-level period occurs in the signal wdluz whose delay time is short, while the low-level period does not occur in the signal pwdluz whose delay time is long. Consequently, a pulse of the data transfer gate signal wdlupz is generated and the data transfer GD[0] is performed, while a pulse of the data receive gate signal pwdlupz is not generated and the data receive GD1[1] is not performed. This results in opening of the data transfer gate GD2 and closing of the data receive gate GD1, whereby a proper data of the write operation WR0 is stored in the buffer 304U, and the data is written to the memory cell with the data write GD3[0] and the write command WR[0], so that a normal operation is secured.

Figure 9:
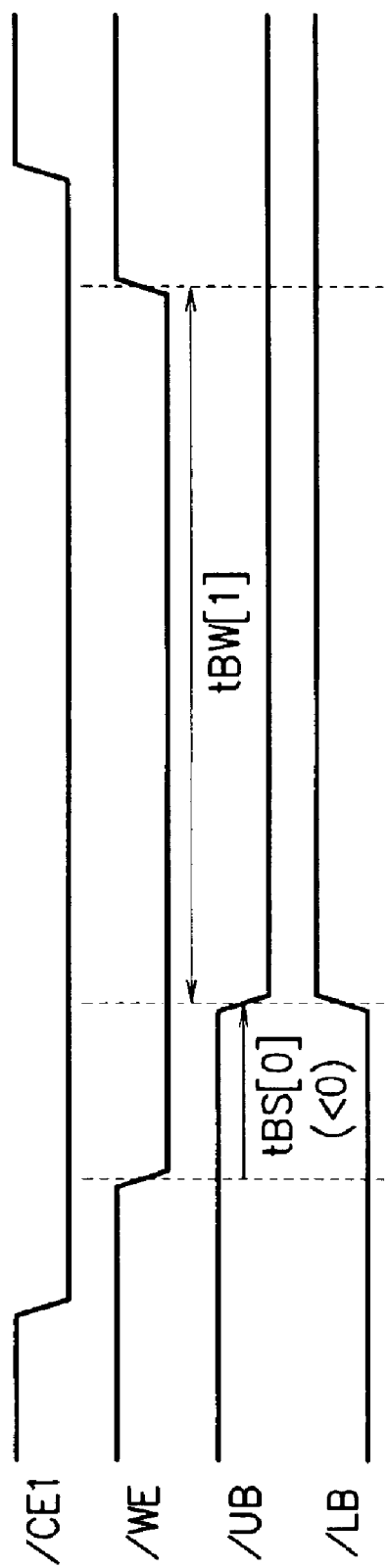
FIG. 9 illustrates a tBS specification and a tBW specification.

FIG. 9 is for explaining a tBS specification and a tBW specification. As described above, if the byte mask signals /UB and /LB are changed and fixed when or before the write enable signal /WE falls, a normal write operation can be performed. If the byte mask signals/UB and /LB change after the falling of the write enable signal /WE, a measure has to be taken to prevent a malfunction. Here, a time tBS[0] indicates a negative time period from the activation (low level) of the write enable signal /WE to the changing of the byte mask signals /UB and /LB. A time tBW[1] is a time period from the changing of the byte mask signals /UB and /LB to the deactivation (high level) of the write enable signal /WE.

FIGS. 10A and 10B show operational modes of the memory device of the referential example in FIG. 4. Data transfer GD2 and data receive GD1 are both carried out, or otherwise, neither of them are carried out. The horizontal axis shows a time tBS[ns], and the left part to the 0 (zero) line shows negative values.

FIG. 10A shows a case in which data write GD3 is prioritized over the data transfer GD2 and the data receive GD1. The time tBS (negative value) becomes shorter in the order of operational modes 1, 2a, 3a, 4, and 5.

In the operational mode 1 of a cycle, the data write GD3, data transfer GD2 and data receive GD1 are not performed, and mask receive GM1 receives the high level as a mask signal /UB. Accordingly, writing to a memory cell is not performed, and malfunction (data corruption) does not occur.

In the operational mode 2a of the cycle, the data write GD3 is performed while the data transfer GD2 and the data receive GD1 are not performed, and the mask receive GM1 receives the high level as the mask signal /UB. Here, since the data write GD3 is performed while the data transfer GD2 is not performed, a proper data is not written to the memory cell, whereby in some cases data corruption occurs.

In the cycle of the operational mode 3a, the data write GD3, the data transfer GD2, and the data receive GD1 are performed, and the mask receive GM1 receives the high level as the mask signal /UB. Here, as shown in FIG. 8B, the data transfer GD2 and the data receive GD1 may overlap timewise, so that an improper data is written to the memory cell and data corruption occurs.

In the operational mode 4 of the cycle, the data write GD3, the data transfer GD2, and the data receive GD1 are performed, and the mask receive GM1 receives an undefined value as the mask signal /UB. Because the undefined value is received as the mask signal /UB, an appropriate mask control (column line selection) is not secured, whereby data corruption may occur. Since the operational mode 4 is the boundary of the high level (operational modes 1 to 3a) and the low level (operational mode 5) of the mask signal /UB, the mask signal /UB becomes an undefined value.

In the operational mode 5 of the cycle, the data write GD 3, data transfer GD 2, and data receive GD1 are performed, and the mask receive GM1 receives the low level as the mask signal /UB. Here, a normal write operation is performed.

FIG. 10B shows a case where the data transfer GD2 and the data receive GD1 are prioritized over the data write GD3. The time tBS (negative value) is shorter in the order of the operational modes 1, 2b, 3b, 4, and 5. The operational mode 1, 4, and 5 are identical to those in FIG. 10A. The operational mode 3b in FIG. 10B may result in data corruption which is similar to that of the operational mode 3a in FIG. 10A.

In the operational mode 2b of a cycle, the data write GD3 is not performed, the data transfer GD2 and the data receive GD1 are performed, and the mask receive GM1 receives the high level as the mask signal /UB. Here, since the data receive GD1 and the data transfer GD2 are performed while the data write GD3 is not performed, the data is overwritten in the buffer 304U, whereby in some cases data corruption occurs.

Figure 11:
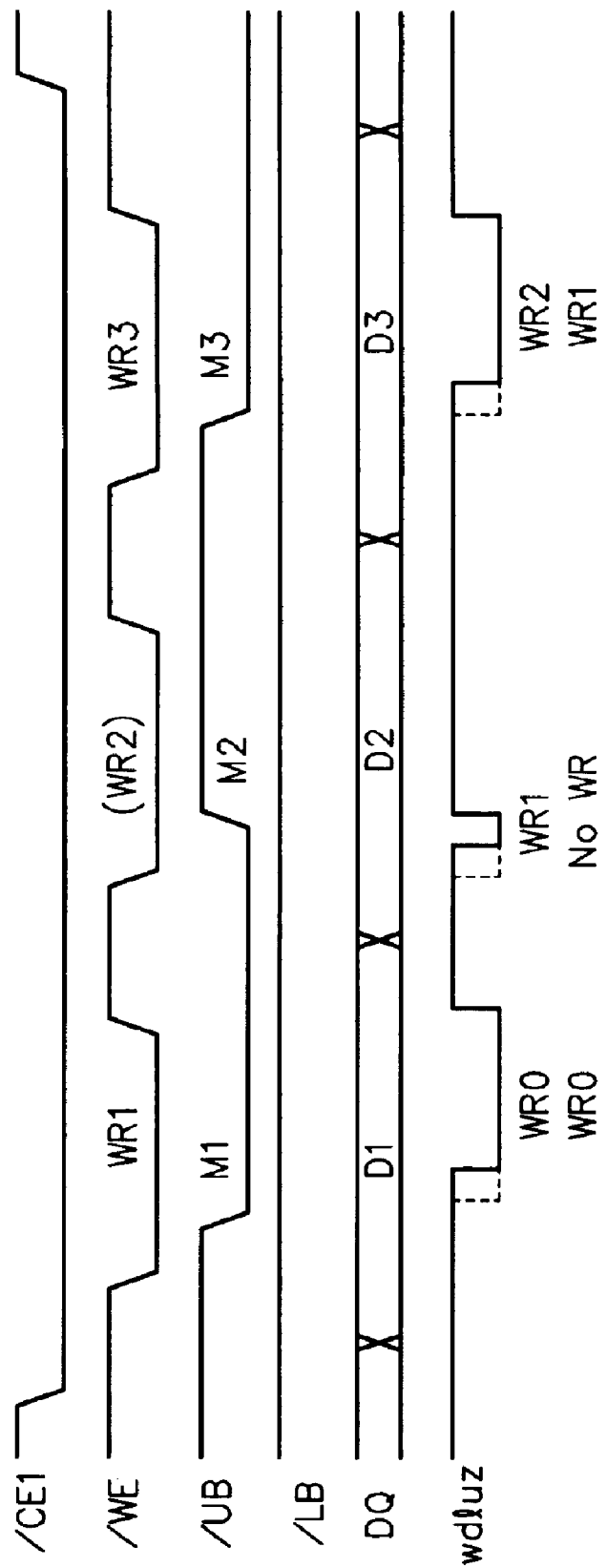
FIG. 11 is a timing chart showing a write operation example.

FIG. 11 shows a write operation example for explaining FIGS. 12 to 15, and FIGS. 17 and 18. The low-level period of the write enable signal /WE occurs in the order of the write operations WR1, WR2, and WR3. In such periods, the mask signal /LB indicates high level. In the write operation WR1, M1 is supplied as the mask signal /UB, and D1 is supplied as the data DQ. In the write operation WR2, M2 is supplied as the mask signal /UB, and D2 is supplied as the data DQ. In the write operation WR3, M3 is supplied as the mask signal /UB, and D3 is supplied as the data DQ.

Figure 12:
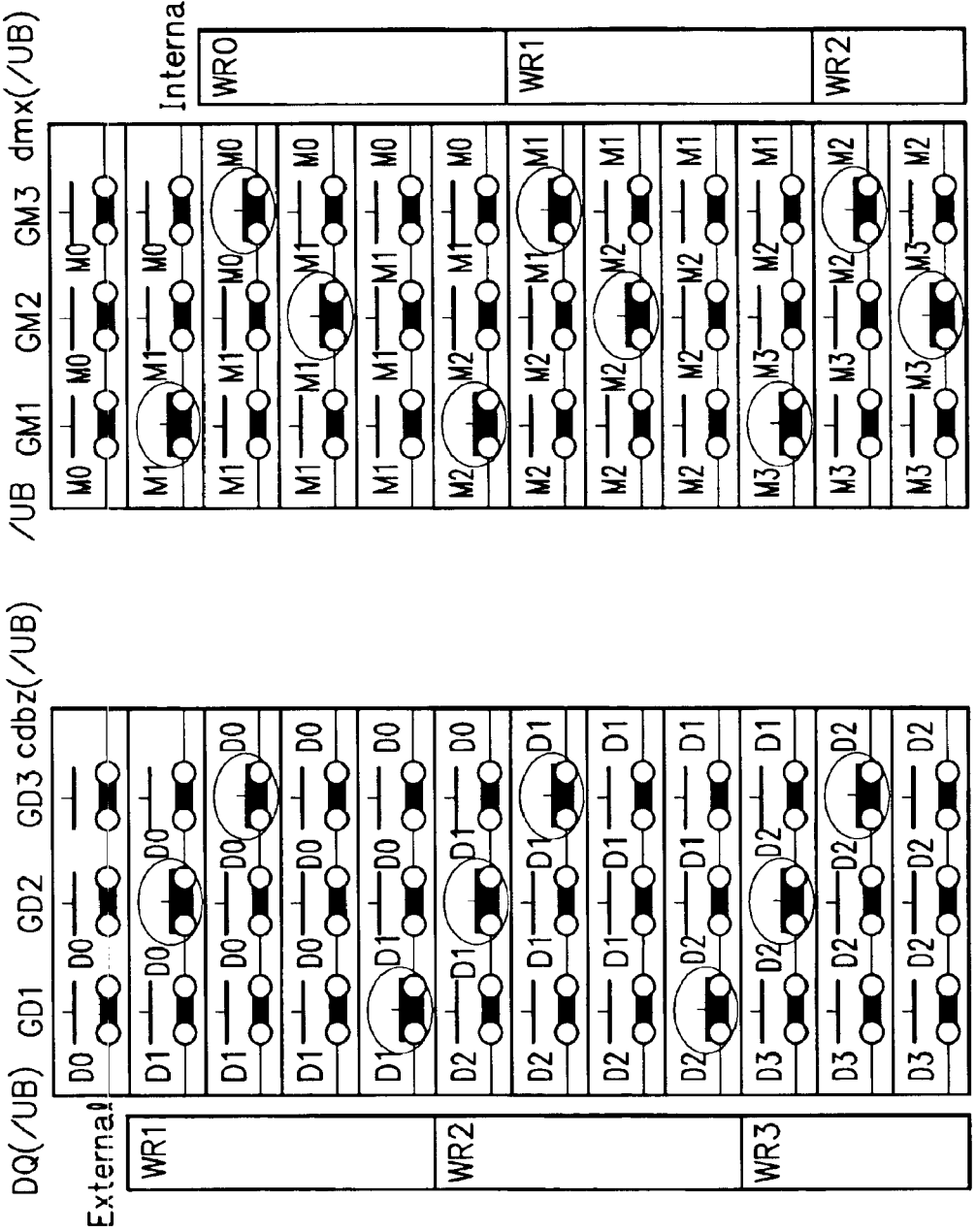
FIG. 12 illustrates an example of a data control and a mask control at an operational mode 5.

FIG. 12 shows data control and mask control examples of the operational mode 5. A case is shown in which the low-level period of the write enable signal /WE (write operations WR1 to WR3) is sufficiently long.

When the write operation WR1 is directed with the falling of the write enable signal /WE, the switch of the data transfer gate GD2 is closed, and data D0 (zero) is stored in the buffer 304U, while the switch of the mask receive gate GM1 is closed and the mask signal M1 is stored in the buffer 312U. The switch of the data write gate GD3 is then closed, and the data D0 (zero) is outputted to the data bus, while the switch of the mask write gate GM 3 is closed and the mask signal M0 (zero) is outputted. The switch of the mask transfer gate GM2 is subsequently closed and the mask signal M1 is stored in the buffer 314U. The switch of the data receive gate GD1 is then closed, and the data D1 is stored in the buffer 302U. The write operation WR0 (zero) (data D0 (zero)) is carried out in a normal manner.

When the write operation WR2 is directed with the falling of the write enable signal /WE, the switch of the data transfer gate GD2 is closed and the data D1 is stored in the buffer 304U. The switch of the mask receive gate GM1 is closed and the mask signal M2 is stored in the buffer 312U. The switch of the data write gate GD3 is then closed and the data D1 is outputted to the data bus. The switch of the mask write gate GM3 is closed and the mask signal M1 is outputted. The switch of the mask transfer gate GM2 is then closed, and the mask signal M2 is stored in the buffer 314U. The switch of the data receive gate GD1 is then closed, and the data D2 is stored in the buffer 302U. The write operation WR1 (data D1) is carried out in a normal manner.

When the write operation WR3 is directed with the falling of the write enable signal /WE, the switch of the data transfer gate GD2 is closed and the data D2 is stored in the buffer 304U, while the switch of the mask receive gate GM1 is closed and the mask signal M3 is stored in the buffer 312U. The switch of the data write gate GD3 is then closed and the data D2 is outputted to the data bus, while the switch of the mask write gate GM3 is closed and the mask signal M2 is outputted. The switch of the mask transfer gate GM2 is subsequently closed and the mask signal M3 is stored in the buffer 314U. The switch of the data receive gate GD1 is then closed and the data D3 is stored in the buffer 302U. The write operation WR2 (data D2) is carried out in a normal manner.

Figure 13:
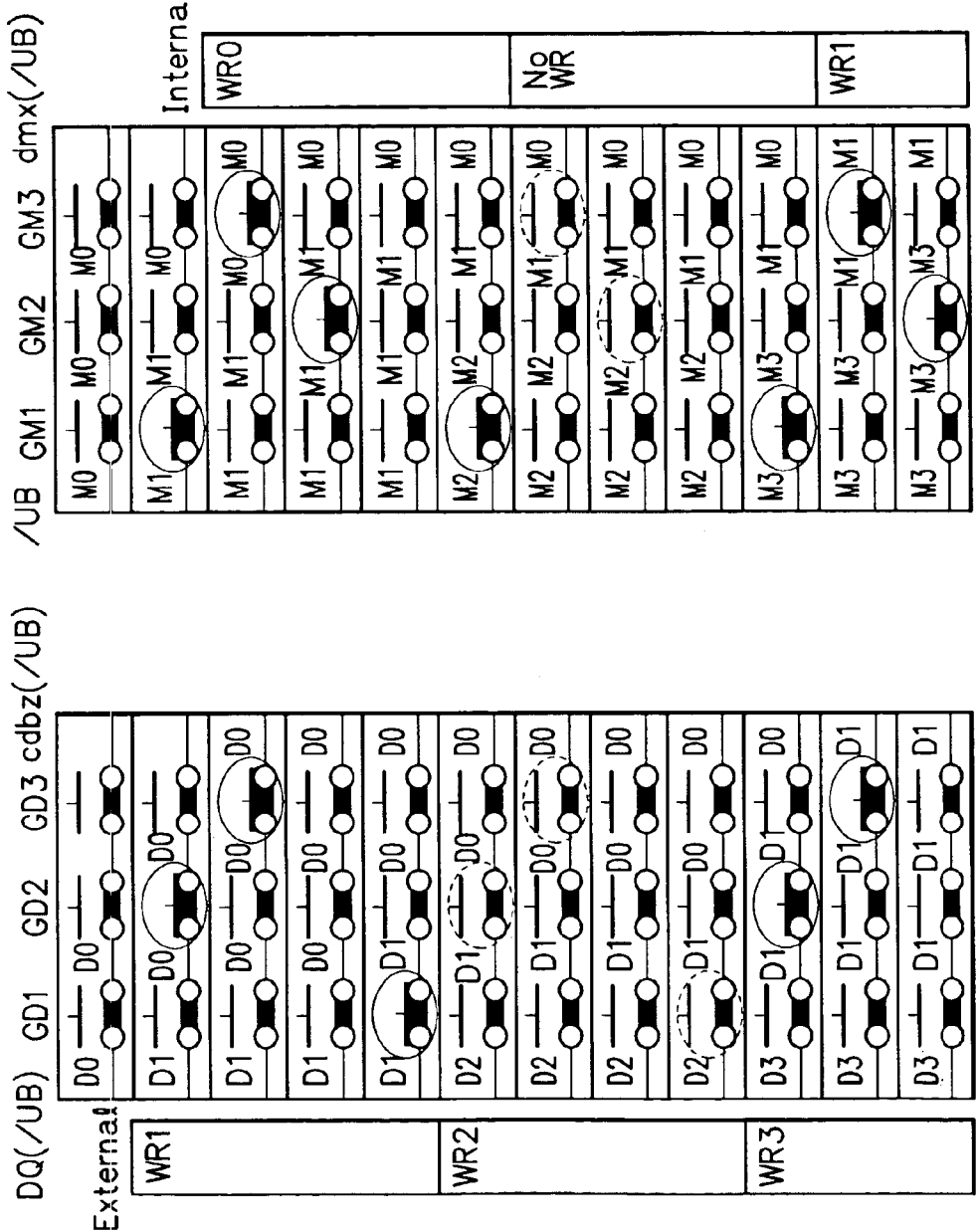
FIG. 13 illustrates an example of a data control and a mask control at an operational mode 1.

FIG. 13 is data control and mask control examples of the operational mode 1. It is basically the same as examples in FIG. 12, except for those described below. A case is shown in which the low-level period of the write enable signal /WE (write operation WR2) is short.

When the write operation WR2 is directed with the falling of the write enable signal /WE, the switch of the data transfer gate GD2 is kept open, while the switch of the mask receive gate GM1 is closed and the mask signal M2 is stored in the buffer 312U. Subsequently, the switch of the data write gate GD3 is kept open, and the switch of the mask write gate GM3 is kept open. Further, the switch of the mask transfer gate GM2 is kept open. Subsequently, the switch of the data receive gate GD1 is kept open. The write operation WR1 (data D1) is not carried out in this cycle, and is carried out in the subsequent cycle.

Figure 14:
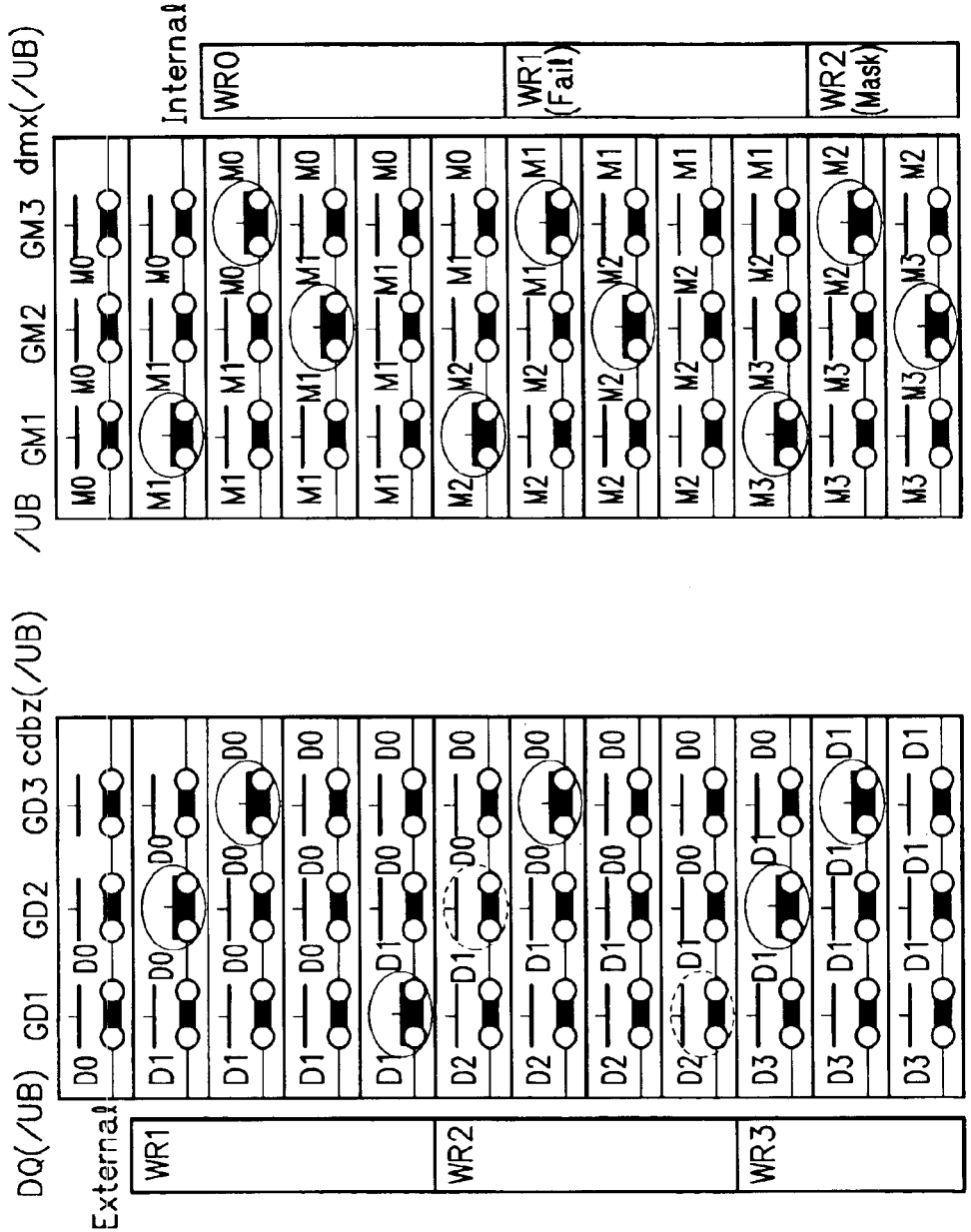
FIG. 14 illustrates an example of a data control and a mask control at an operational mode 2*a*.

FIG. 14 shows examples of data control and mask control by the operational mode 2a. It is essentially the same as FIG. 12, except for the points which will be explained below.

These describe the cases where the low level period of the write enable signal /WE (write operation WR2) is around an intermediate value.

When the write operation WR2 is directed with the falling of the write enable signal /WE, the switch of the mask receive gate GM1 closes while the switch of the data transfer gate GD2 is kept open, and the mask signal M2 is stored in the buffer 312U. The switch of the data write gate GD3 then closes, whereby a data D0 (zero) is outputted to the data bus, while the switch of the mask write gate GM3 closes, whereby the mask signal M1 is outputted. Subsequently, the switch of the mask transfer gate GM2 closes and the mask signal M2 is stored in the buffer 314U. Thereafter, the switch of the data receive gate GD1 is kept open.

In the above-described cycle, an improper data D0 (zero) is written with the mask signal M1, resulting in data corruption. In a subsequent cycle, the mask signal is high level, and the data bus of the data D1 is not connected to the memory cell, so that writing to the memory cell is not performed. As a result, the write operation of the data D1 is not carried out, and the data is corrupted.

Figure 15:
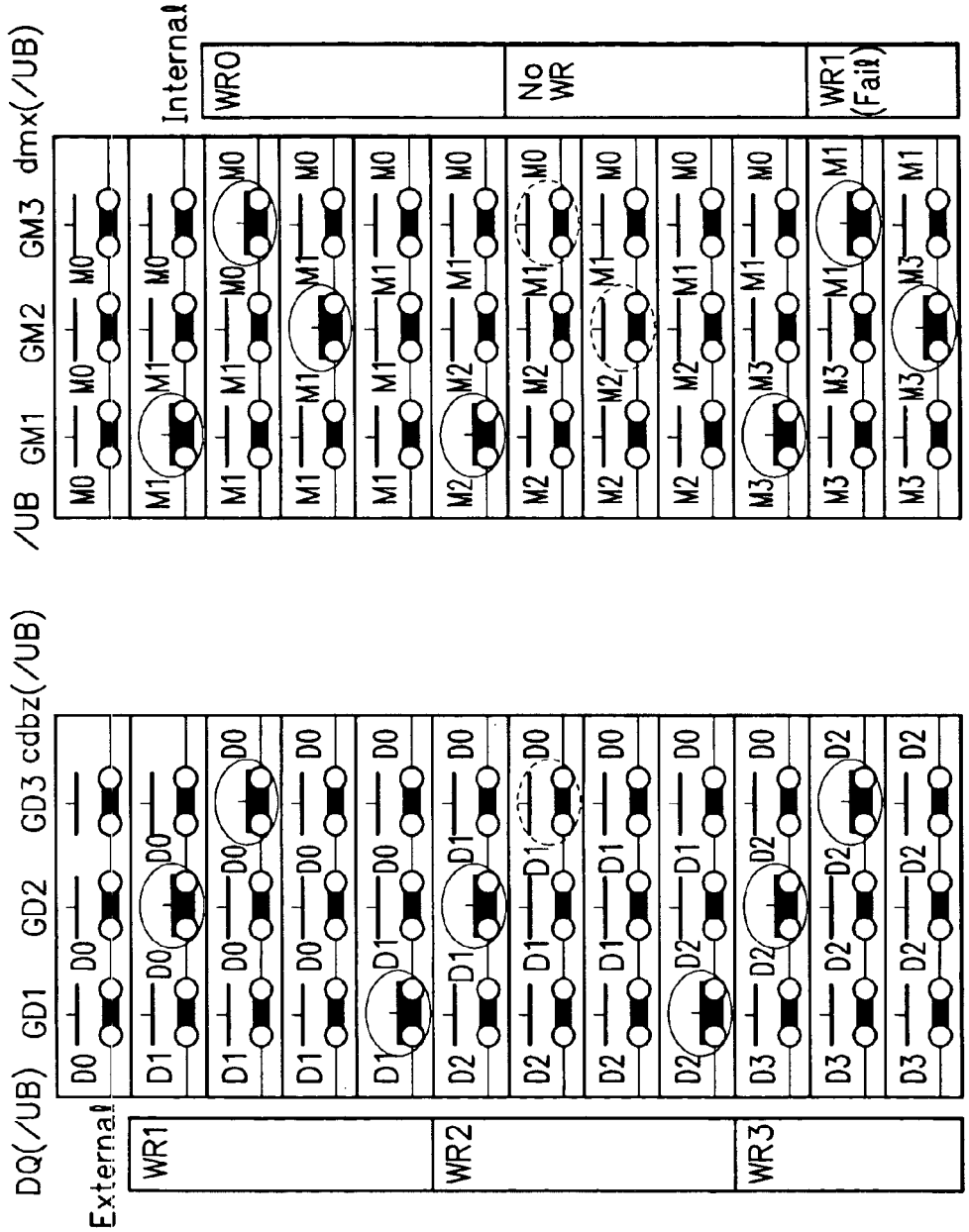
FIG. 15 illustrates an example of a data control and a mask control at an operational mode 2*b*.

FIG. 15 shows an example of data control and mask control in the operational mode 2b. It is essentially the same as FIG. 12, except for the points which will be explained below. These describe the cases where the low level period of the write enable signal /WE (write operation WR2) is around an intermediate value.

When the write operation WR2 is directed with the falling of the write enable signal /WE, the switch of the data transfer gate GD2 closes and the data D1 is stored in the buffer 304U, while the switch of the mask receive gate GM1 is closed and the mask signal M2 is stored in the buffer 312U. Subsequently, the switch of the data write gate GD3 is kept open, and the switch of the mask write gate GM3 is kept open. Next, the switch of the mask transfer gate GM2 is kept open. Thereafter, the switch of the data receive gate GD1 closes and the data D2 is stored in the buffer 302U.

In this cycle, the data D0 (zero) is updated while the switch of the data write gate GD3 is kept open, and no new data writing is performed. In a subsequent cycle, the data D2 is written to the memory cell. This means that the write operation WR1 (data D1) is skipped, so that data corruption occurs.

As described above, in FIG. 10A, the data transfer GD2 is not performed in the state of the operational mode 2a commenced by the data write GD3, so that the data is corrupted. In the region of the operational mode 3a, the data receive pulse and the data transfer pulse simultaneously occur in the boundary of the operational modes 2a and 3a, so that the data passes through in the subsequent cycle, resulting in corruption of the data in the buffer 304U. In the operational mode 4, instability of the mask receive GM1 prohibits the intended write operation. In the operational mode 5, the mask receive GM1, data receive GD1, and the data transfer GD2 are normally performed, allowing the intended write operation to be carried out.

Figure 16:
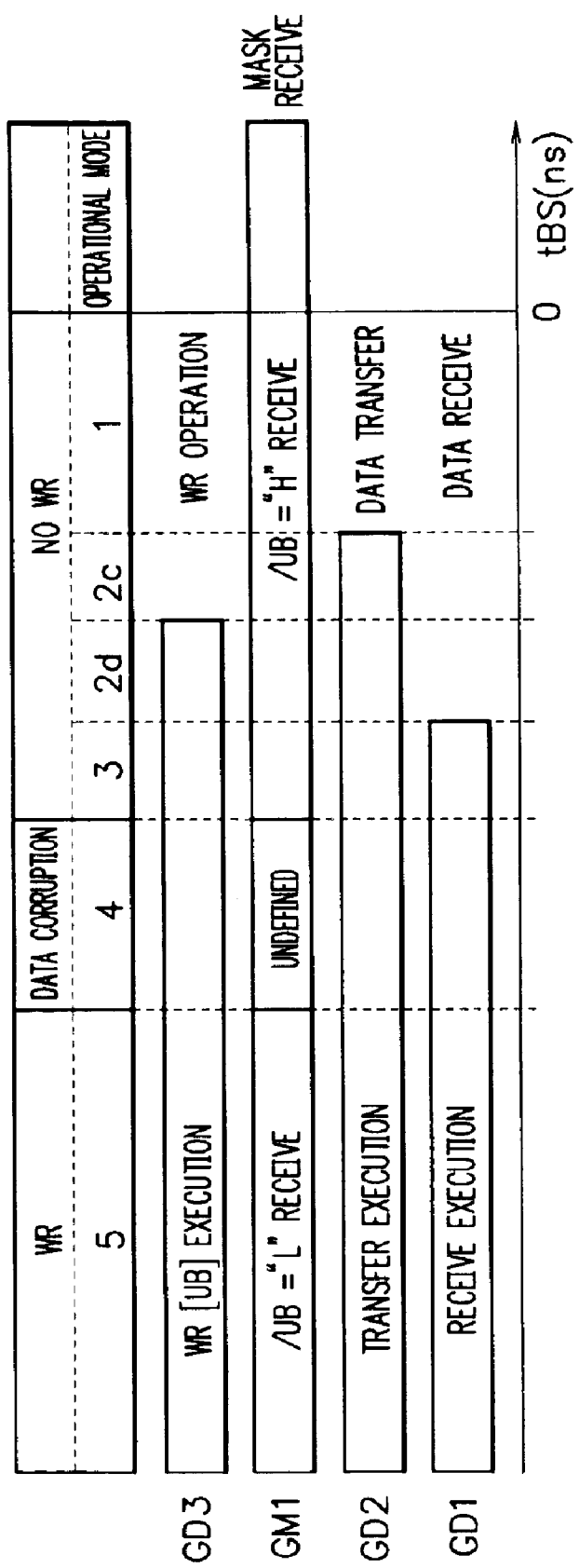
FIG. 16 illustrates an operational mode of the memory device according to the present embodiment in FIG. 6.

FIG. 16 shows an operational mode of the memory device of the present embodiment in FIG. 6. The occurring priority is higher in the order of the data receive GD1, the data write GD3, and the data transfer GD2. The horizontal axis shows the time tBS[ns], and values for the left side of the 0 (zero) line are negative. The time tBS (negative value) is smaller in the order of the operational modes 1, 2c, 2d, 3, 4, and 5. The operational modes 1, 3, 4, and 5 are identical to those for FIG. 10A.

In the operational mode 2c, of a cycle, the data transfer GD2 is performed while the data write GD3 and the data receive GD1 are not performed, and the mask receive GM1 receives the high level as the mask signal /UB. Details thereof will be explained later with reference to FIG. 17.

In the operational mode 2d of the cycle, the data write GD3 and the data transfer GD2 are performed while the data receive GD1 is not performed, and the mask receive GM1 receives the high level as the mask signal /UB. Details thereof will be explained later with reference to FIG. 18.

In the operational mode 3, the data corruption does not occur by an overlap of the data transfer GD2[0] and the data receive GD1[1] as shown in FIG. 8B. In such a case, as shown in FIG. 8C, the data receive GD1[1] does not occur, which means the operational mode is 2d. In the operational mode 3, the data transfer GD2[0] and the data receive GD1[1] are performed without overlapping, so that data corruption does not occur.

Figure 17:
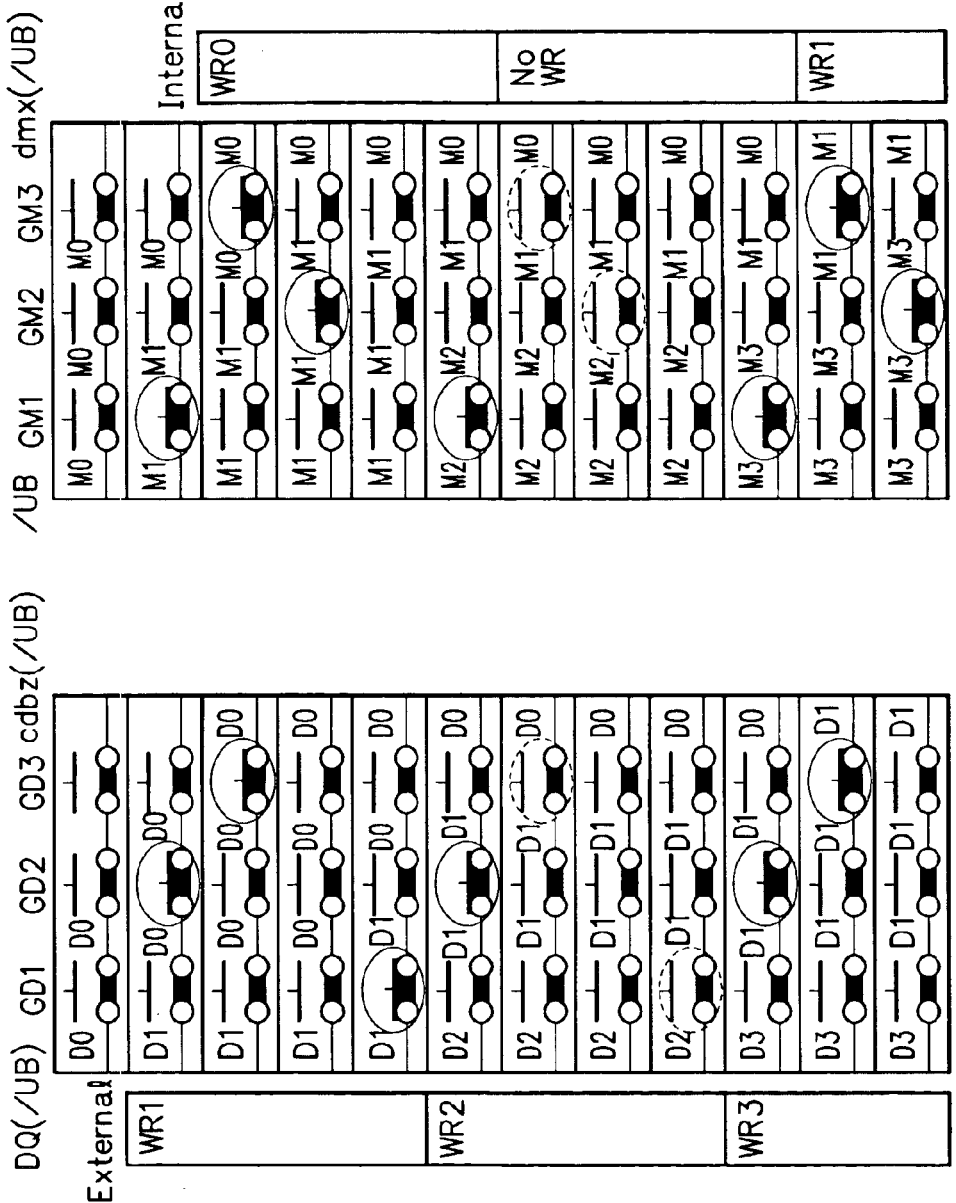
FIG. 17 illustrates an example of a data control and a mask control at an operational mode 2*c*.

FIG. 17 shows examples of data control and mask control of the operational mode 2c. It is essentially the same as FIG. 12, except for the points which will be explained below. These describe the cases where the low level period of the write enable signal /WE (write operation WR2) is around an intermediate value.

When the write operation WR2 is directed with the falling of the write enable signal /WE, the switch of the data transfer gate GD2 is closed and the mask signal M2 is stored in the buffer 312U. Subsequently, the switch of the data write gate GD3 is kept open, and the switch of the mask write gate GM3 is kept open. Next, the switch of the mask transfer gate GM2 is kept open. Subsequently, the switch of the data receive gate GD1 is kept open. The write operation WR1 (data D1) is not performed in this cycle, and is performed in the subsequent cycle.

Figure 18:
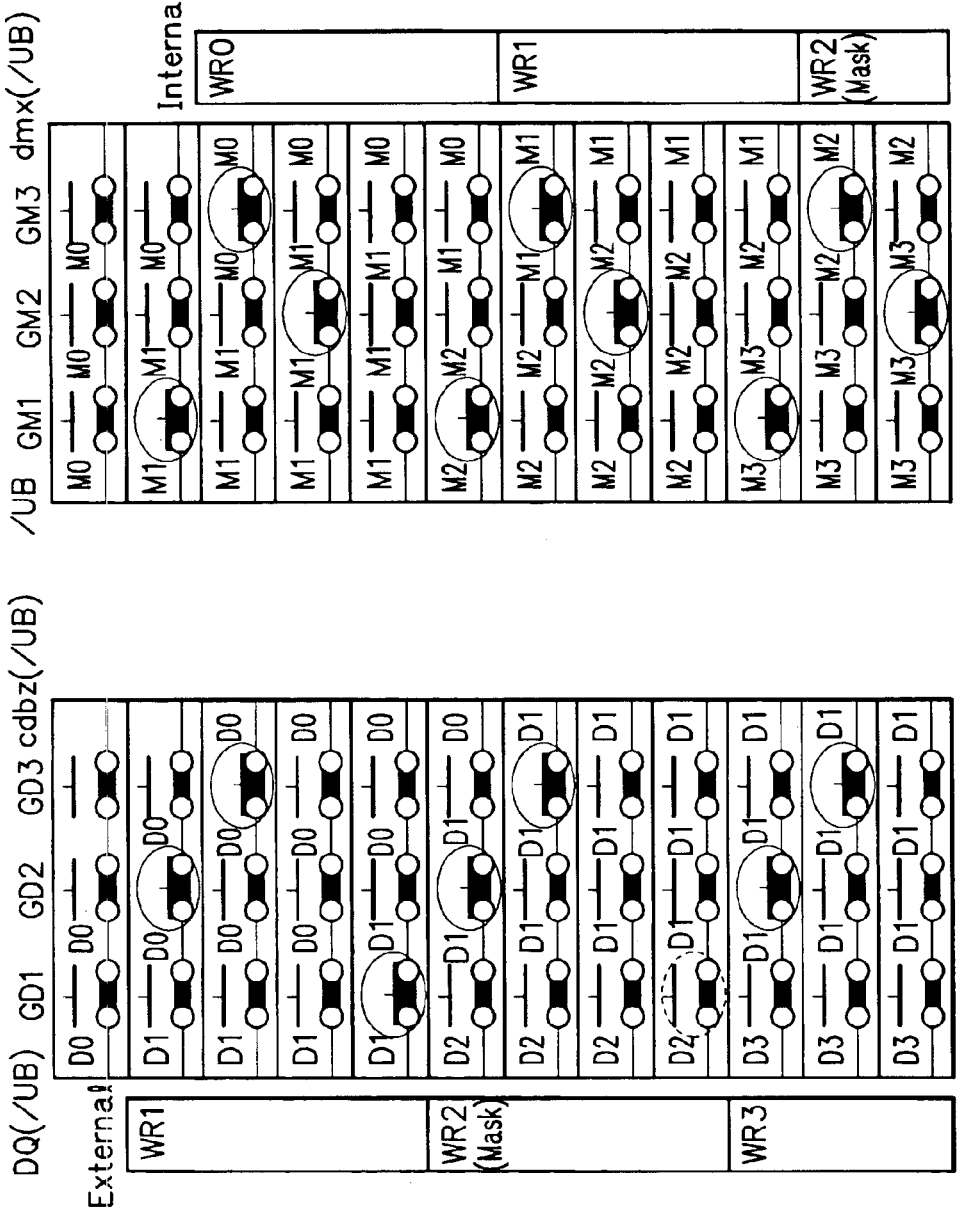
FIG. 18 illustrates an example of a data control and a mask control at an operational mode 2*d*.

FIG. 18 shows examples of data control and mask control of the operational mode 2d. It is essentially the same as FIG. 12, except for the points which will be explained below. These describe the cases where the low level period of the write enable signal /WE (write operation WR2) is around an intermediate value.

When the write operation WR2 is directed with the falling of the write enable signal /WE, the switch of the data transfer gate GD2 is closed, whereby the data D1 is stored in the buffer 304U, and the switch of the mask receive gate GM1 is closed, whereby the mask signal M2 is stored in the buffer 312U. Subsequently, the switch of the data write gate GD3 is closed, whereby the data D1 is outputted to the data bus, and the switch of the mask write gate GM3 is closed, whereby the signal M1 is outputted. Next, the switch of the mask transfer gate GM2 is closed and the mask signal M2 is stored in the buffer 314U. Subsequently, the switch of the data receive gate GD1 is kept open.

In this cycle, the write operation WR1 (data D1) is normally carried out. In the subsequent cycle, the mask signal becomes high level, and the data bus and the memory cell are not connected, so that the data D1 is not written to the memory cell. Consequently, the writing of the data D0 (zero) and D1 are normally carried out.

As described above, in the present embodiment, neither the data write GD3 nor the data transfer GD2 are performed in the operational mode 1. In the operational mode 2c, the data write GD3 is not carried out, while the data transfer GD2 is performed in preparation for the subsequent write operation. In the operational mode 2d, the mask signal is high level and the write command is recognized, but an actual writing is not carried out. At that time, the data at risetime of the byte mask signal is not received. In the operational mode 3, the mask signal is high level and the write command is recognized, but an actual writing is not carried out. At that time, the data at risetime of the byte mask signal is received. In the operational mode 4, the write operation is performed because of the erroneous receiving of the mask signal of an undefined value, which causes data corruption. In the operational mode 5, the write operation is performed by receiving the data corresponding to the low level of the byte mask signal.

It is in the operational mode 4 that the data corruption occurs, where the timing for the mask receive GM1 fluctuates because of the timing fluctuation by the fluctuation of the power supply voltage or the like. Hence, the operations become unstable in which "write" (WR) or "no write" (No WR) occurs depending on the conditions. In the case of "no write" (No WR), actual data writing is not performed even if the data is received, so long as the high level is received as the mask signal. In the case of "write" (WR), the data corresponding to the low-level of the mask signal is written, since it is secured that the data is received.

That is to say, when the write operation is not performed, data in a semiconductor memory device sustains its state, and when the write operation is performed, it is so performed by writing pertinent data in the case the write command is recognized. It is thus prevented to perform the write operation in spite of not receiving or transferring data.

FIG. 10A illustrates a state in which only the mask receive timing in the operational mode 4 fluctuates, but in actual cases, the timings for the data transfer GD2 (in the operational modes 2a and 3a), the data write GD3 (in the operational modes 1 to 2a), and the data receive GD1 (in the operational modes 2a and 3a) also fluctuate. However, even if those positions shift, "no write" (No WR) does not turn into "write" (WR), and "write" (WR) does not turn into "no write" (No WR). The malfunction period can be limited within the fluctuation in the mask receive timing (in operational mode 4). The same way holds true for the case in FIG. 16.

In FIG. 16, if the timing boundary of the data receive GD1 fluctuates in the similar extent to the mask receive GM1, and is set in the region of the operational mode 4, the positional variations of the data receive GD1 due to such fluctuations extend into the region of the operational mode 5. Accordingly, the data to be written with the write operation becomes unstable, resulting in extension of the data corruption into the region of the operational mode 5. This also occurs where the timing boundary of the data write GD3 set in the operational modes 2c to 2d is set in the region of the operational mode 4, and the case where the timing boundary of the data transfer GD2 set in the operational modes 1 to 2c is set in the region of the operational mode 4.

Accordingly, in order to minimize such timings as in which the erroneous writings are performed, an appropriate mask control is carried out in the case that the data write GD3 is performed, such that data corruptions are restricted, and a delay in the write cycle operation, where the write command occurs behind time, can be prevented.

FIG. 19A shows the address, the chip enable signal /CE1, the write enable signal /WE, the upper byte mask signal /UB, and the lower byte mask signal /LB. The cycles C1, C2, and so forth are determined depending on the switching of the address.

FIG. 19B shows a write operation example of the memory device in the referential example in FIG. 4, by relating itself to FIG. 19A. From the falling edge of the signal webdz which has caused a delay in the falling of the write enable signal /WE, the pulse of the signal wrpz is generated. In the referential example, the delay in the falling edge of the signal webdz should be made long so as not to cause data corruption. This delays the commencement of the write operation, and the ending of the signal rasz showing the core operation also delays, resulting in a delay in the write operation cycle.

As described above, when preventing data corruption with "no write" (No WR), in the referential example, the occurrence of the data write command needs to be controlled. However, this leaves a demerit in which a delayed occurrence of the write operation causes an extension of the write cycle time.

FIG. 19C shows the write operation of the memory device of the present embodiment in FIG. 6, by relating itself to FIG. 19A. From the falling edge of the signal webdz which delayed the falling of the write enable signal /WE, the pulse of the signal wrpz is generated. However, this delayed time can be shortened. By shortening the delayed time, the write operation commencement can be made earlier, the ending of the signal rasz showing the core operation becomes earlier, and the write operation cycle becomes quicker. In the present embodiment, data corruption can be prevented without having to delay the write operation.

FIG. 20 is a flowchart showing a processing example of the write operation of the present embodiment. This flowchart illustrates the processing where there is an inputting of a state that violates the tBW specification (a state in which the tBS in FIG. 9 is a negative value).

In the step S2001, it is checked whether the data write GD3 is going to be performed or not. If it is to be performed, a step S2002 follows, and if it is not performed, a step S2006 follows. In the step S2002, it is checked whether the data transfer GD2 is going to be performed or not. If it is to be performed, a step S2003 follows, and if it is not performed, a preceding data is going to be reused, causing data corruption. That is to say, where the data write GD3 is performed, the data transfer GD2 always has to be precedently performed in the same cycle.

In the step S2003, it is checked whether the mask receive GM1 of the illegal byte is high level or low level. If it is high level, writing to memory cell is not performed, so that a step S2004 follows. If it is low level, an erroneous data is written to the memory cell, so that the data is corrupted.

In the step S2004, it is checked whether the data receive GD1 is to be performed or not. Regardless of performing or non-performing, a step S2005 follows, and in the following cycle, the illegal byte is masked and the write operation is performed. That is to say, the performing or the non-performing of the data receive GD1 does not matter. Because of the masking, the data of the data bus can be any data.

In a step S2006, it is checked whether the data transfer GD2 is to be performed or not. Regardless of performing or non-performing, a step S2007 follows. That is to say, the data transfer GD2 does not need to be performed.

In the step S2007, it is checked whether the mask receive GM1 is to be performed or not. If it is not to be performed, a step S2008 follows. If it is to be performed, the mask signal in the buffer is corrupted, resulting in data corruption.

In the step S2008, it is checked whether the data receive GD1 is to be performed or not. If it is not to be performed, a step S2009 follows. If it is to be performed, the data in the buffer is corrupted, resulting in data corruption.

In the step S2009, a proper write data can be maintained.

As described above, data corruption occurs if one of the following conditions are violated: (1) to be able to perform the data transfer GD2 without having to perform the data write GD3; (2) not to perform the data receive GD1 if the data write GD3 is not performed; and (3) not to receive a low-level-state mask signal. In the present embodiment, data corruption can be prevented by not violating the above-listed points.

By finely designing settings on priorities among the data write, mask receive, data receive, and data transfer, the possibility of performing erroneous writing can be substantially reduced. Accordingly, the write-cycle-affecting measure, in which the occurrence of the write command is delayed, does not need to be taken.

By establishing the priorities on the controls of the data receive and data transfer, the possibility of data corruption is reduced. Even if a write command whose length falls short of the normal length is introduced because of a mask control, a delay in the write operation or the data corruption can be prevented.

When the write command whose length falls short of the normal length is introduced into a semiconductor memory device, data corruption due to the erroneous writing can be prevented without extending the cycle time, in such a manner that the control is performed by establishing the pulse occurring priorities among data write, mask receive, data receive, and data transfer.

The write operation is performed by synthesizing the write enable signal /WE (write basic signal) and the byte mask signals /UB and /LB, and the data receive and the data transfer are carried out with the respective edge pulses of the rising and the falling.

The write command pulse and the mask receive pulse are generated based on the falling of the synthesized signal of the signals /WE, /UB, and /LB. The write operation is in the late-write architecture in which the writing to the memory cell is performed upon the falling of the synthesized signal of the signals /WE, /UB, and /LB. The probability of the data write pulse occurrence is lower than that of the data transfer pulse, and by securing the occurrence of the data transfer pulse upon performing of the data write, the data corruption is prevented. In the case where a write command whose length falls short of the normal length is introduced, the data corruption is prevented in such a manner that the mask becomes high level when the data receive pulse occurs.

When the write command whose length falls short of the normal length is introduced, the data receive pulse is controlled not to be more likely to occur than the data transfer pulse, so as not to cause data corruption by occurrences of the data receive pulse and the data transfer pulse at a uniform timing.

By using the mask signal for preventing data corruption, the data is made such that it is not corrupted just because the data write pulse occurs when the write command falling short of the normal length is entered. Accordingly, the data write pulse can be made to easily occur, and the commencement of the write operation and the write operation cycle can be shortened.

When the write enable signal is activated and thereafter the data mask signal changes, depending on the time period therebetween, data is not inputted to the first buffer by control of the data receive gate, and at the same time data is inputted to the second buffer by control of the data transfer gate. As a result, data corruption is prevented which occurs upon partial overlapping of the data transfer time and the data receiving time, where a subsequent data is erroneously inputted to the second buffer through the data receive gate and the data transfer gate at a time when a present data has to be inputted to the second buffer. Such prevention of data corruption can be performed without causing delay in the write operation in the cycle.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A memory device, comprising:
    a data receive gate to buffer, in a first buffer, data to be inputted, by gate control;
    a data transfer gate to input the data of said first buffer and buffer the same data in a second buffer by gate control;
    a data write gate to output the data of said second buffer to a data bus by gate control;
    a memory cell to write and store the data in said data bus;
    a selector not to connect said data bus to said memory cell when masked by a data mask signal, and to connect the data bus to the memory cell when the masking is released by the data mask signal; and
    a control circuit to input data to the first buffer by controlling said data receive gate according to a write enable signal and the data mask signal in a present cycle, and input the data of the first buffer to the second buffer by controlling said data transfer gate and then output the data in the second buffer to said data bus by controlling said data write gate in a subsequent cycle,
    wherein, in said cycle of said control circuit, data is not inputted to the first buffer by controlling the data receive gate, and at the same time data is inputted to the second buffer by controlling the data transfer gate, in a certain cycle depending on a time period from activation of the write enable signal to changing of the data mask signal.

2. The memory device according to claim 1, wherein, in said cycle of said control circuit, data is not inputted to said first buffer by said data receive gate control, while data is inputted to said second buffer by said data transfer gate, and the data in the second buffer is outputted to said data bus by said control of data write gate.

3. The memory device according to claim 1, wherein, in said cycle of said control circuit, data is not inputted to the first buffer by controlling the data receive gate, while data is inputted to the second buffer by controlling the data transfer gate, and the data in the second buffer is not outputted to the data bus by controlling the data write gate.

4. The memory device according to claim 1, wherein, in said cycle of said control circuit, said selector does not connect the data bus to the memory cell in a subsequent cycle, when data is not inputted to the first buffer by controlling the data receive gate, and inputted to the second buffer by controlling the data transfer gate.

5. The memory device according to claim 1, wherein, in said control circuit when the data in the second buffer is outputted to the data bus by controlling the data write gate, data is always inputted to the second buffer by controlling the data transfer gate within the cycle thereof and before controlling the data write gate.

6. The memory device according to claim 5, wherein, in said control circuit, depending on a time period from activation of the write enable signal to changing of the data mask signal, in the cycle, data is inputted to the second buffer by controlling the data transfer gate, and data is not outputted to the data bus by controlling data write gate.

7. The memory device according to claim 1, further comprising:
    a first delay circuit to generate a first signal according to the write enable signal and the data mask signal, and output, as a first delay signal, a signal which delays, for a first delay time period, a changing point at which the first signal changes from a deactivated state to an activated state;
    a second delay circuit to output, as a second delay signal, a signal which delays, for a second delay time period which is longer than said first delay time period, a changing point at which the first signal changes from a deactivated state to an activated state; and
    wherein, in said control circuit, the data transfer gate is controlled by pulse at the changing point at which said fist delay signal changes from the deactivated state to the activated state, whereby data is inputted to the second buffer, and the data receive gate is controlled by pulse at the changing point at which the second delay signal changes from the activated state to the deactivated state, whereby data is inputted to the first buffer.

8. The memory device according to claim 7, wherein:
    in said first delay circuit, is generated a first signal to activate a period during which the write enable signal is activated and the data mask signal is in a mask-releasing state, and is outputted, as a fist delay signal, a signal which delays, for a first delay time period, a changing point at which the first signal changes from a deactivated state to an activated state;
    in said second delay circuit, is outputted, as a second delay signal, a signal which delays, for a second delay time period which is longer than said first delay time period, a changing point at which said first signal changes from a deactivated state to an activated state; and
    in said control circuit, data is inputted to the second buffer by controlling the data transfer gate by pulse at a changing point at which the first delay signal changes from a deactivated state to an activated state, and data is outputted to the first buffer by controlling the data receive gate by pulse at a changing point at which the second delay signal changes from an activated state to a deactivated state.

9. The memory device according to claim 1, wherein, in a cycle in which the activation period of the write enable signal is short, data is inputted to the second buffer by controlling the data transfer gate, and at the same time not inputted to the first buffer by controlling the data receive gate.

10. The memory device according to claim 1, further comprising:
    a mask receive gate to buffer, in a first mask buffer, a data mask signal inputted by gate control;
    a mask transfer gate to input a data mask signal of said first mask buffer and buffer the same signal in a second mask buffer; and
    a mask write gate to output to said selector the data mask signal in said second mask buffer by gate control.

11. The memory device according to claim 1, wherein said data mask signal comprises an upper byte mask signal and a lower byte mask signal.

12. The memory device according to claim 4, wherein, in said cycle of said control circuit, data is not inputted to said first buffer by controlling the data receive gate, while data is inputted to said second buffer by controlling said data transfer gate, and the data in the second buffer is outputted to the data bus by controlling said data write gate.

13. The memory device according to claim 12, wherein, in said cycle of said control circuit, data is not inputted to the first buffer by controlling the data receive gate, while data is inputted to the second buffer by controlling the data transfer gate, and the data in the second buffer is not outputted to the data bus by controlling the data write gate.

14. The memory device according to claim 13, wherein, in the control circuit, when the data in the second buffer is outputted to the data bus by controlling the data write gate, data is always inputted to the second buffer by controlling the data transfer gate in the cycle thereof and before the controlling the data write gate.

15. The memory device according to claim 14, wherein, in said control circuit, data is inputted to the second buffer by controlling the data transfer gate and at the same time is not inputted to the data bus by controlling the data write gate, depending on the time period from the activation of the write enable signal to the changing of the data mask signal in the cycle thereof.

16. The memory device according to claim 15, further comprising:
   a first display circuit to generate a first signal according to the write enable signal and the data mask signal, and output, as a first delay signal, a signal which delays, for a first delay time period, a changing point at which said first signal changes from a deactivated state to an activated state; and
   a second delay circuit to output, as a second delay signal, a signal which delays, for a second time period which is longer than the first time period, a changing point at which said first signal changes from a deactivated state to an activated state,
   wherein, in said control circuit, data is inputted to the second buffer by controlling the data transfer gate by pulse at an changing point at which the first delay signal changes from a deactivated state to an activated state, and data is inputted to the first buffer by controlling the data receive gate by pulse at an changing point at which the second delay signal changes from an activated state to a deactivated state.

17. The memory device according to claim 16, wherein:
   in said first delay circuit, is generated a first signal which activates a period during which the write enable signal is activated and the data mask signal is in mask-releasing state, and is outputted, as a first delay signal, a signal which delays, for a first delay time period, an changing point at which the first signal changes from a deactivated state to an activated state;
   in said second delay circuit, is outputted, as a second delay signal, a signal which delays, for a second delay time period which is longer than said first delay time period, a changing point at which said first signal changes from a deactivated state to an activated state; and
   in said control circuit, data is inputted to the second buffer by controlling the data transfer gate by pulse at a changing point at which the first delay signal changes from a deactivated state to an activated state, and data is inputted to the first buffer by controlling the data receive gate by pulse at a changing point at which the second delay signal changes from an activated state to a deactivated state.

18. The memory device according to claim 17, wherein, in said control circuit, data is inputted to the second buffer by controlling the data transfer gate and is not inputted to the second buffer by controlling the data receive gate, in a cycle where the activation period of the write enable signal is short.

19. The memory device according to claim 18, further comprising:
   a mask receive gate to buffer, in a first mask buffer, a data mask signal inputted by gate control;
   a mask transfer gate to input the data mask signal of said first mask buffer and buffer the same signal in a second mask buffer, by gate control; and
   a mask write gate to output the data mask signal in said second mask buffer to said selector by gate control.

20. The memory device according to claim 19, wherein said data mask signal comprises an upper byte mask signal and a lower byte mask signal.

* * * * *